(12) United States Patent
Kim et al.

(10) Patent No.: US 11,141,890 B2
(45) Date of Patent: *Oct. 12, 2021

(54) SUBSTRATE INCLUDING NANO/MICRO STRUCTURE, METHOD FOR MANUFACTURING THE SAME, METHOD FOR REFINING NANO/MICRO STRUCTURE, METHOD FOR MANUFACTURING NANO/MICRO STRUCTURE NETWORK, AND MANUFACTURING APPARATUS THEREFOR

(71) Applicant: LG Display Co., Ltd., Seoul (KR)

(72) Inventors: Taewhan Kim, Seoul (KR); Dongchul Choo, Yangju-si (KR); Jungyu Lee, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/200,430

(22) Filed: Nov. 26, 2018

(65) Prior Publication Data

US 2019/0118422 A1    Apr. 25, 2019

Related U.S. Application Data

(63) Continuation of application No. 15/102,831, filed as application No. PCT/KR2014/011989 on Dec. 8, 2014, now Pat. No. 10,166,571.

(30) Foreign Application Priority Data

Dec. 10, 2013 (KR) .................. 10-2013-0152954
Jun. 19, 2014 (KR) .................. 10-2014-0074672
(Continued)

(51) Int. Cl.
*B29C 41/20* (2006.01)
*B29C 37/00* (2006.01)
(Continued)

(52) U.S. Cl.
CPC .......... *B29C 41/20* (2013.01); *B29C 37/0067* (2013.01); *B05D 1/00* (2013.01);
(Continued)

(58) Field of Classification Search
USPC .................................................. 427/58, 122
See application file for complete search history.

(56) References Cited

U.S. PATENT DOCUMENTS 8,642,118 B2    2/2014  Goto et al.
8,821,965 B2    9/2014  Duerig et al.
(Continued)

FOREIGN PATENT DOCUMENTS

JP    2013-502515 A    1/2013
KR   10-2010-0125012 A   11/2010
(Continued)

OTHER PUBLICATIONS

A.Schindler et al., "Solution-Deposited Carbon Nanotube Layers for Flexible Display Applications," Physica E, Dec. 11, 2006, pp. 119-123, vol. 37.
(Continued)

*Primary Examiner* — Brian K Talbot
(74) *Attorney, Agent, or Firm* — Fenwick & West LLP

(57) ABSTRACT

Provided is a manufacturing method for a substrate having a microstructure. The manufacturing method for a substrate having a microstructure comprises the steps of: forming a microstructure on the upper surface of an auxiliary substrate; coating a base solution on the microstructure; forming a base substrate covering the microstructure by heattreating the base solution; and removing the auxiliary substrate from the base substrate.

11 Claims, 16 Drawing Sheets

(30) Foreign Application Priority Data

Jul. 31, 2014 (KR) ........................ 10-2014-0097710
Dec. 2, 2014 (KR) ........................ 10-2014-0170362

(51) Int. Cl.

| | | |
|---|---|---|
| B29K 105/00 | (2006.01) | |
| B29C 41/08 | (2006.01) | |
| B29L 31/00 | (2006.01) | |
| B29C 41/12 | (2006.01) | |
| B29C 41/14 | (2006.01) | |
| B29C 41/36 | (2006.01) | |
| B05D 3/02 | (2006.01) | |
| B05D 3/00 | (2006.01) | |
| B05D 1/00 | (2006.01) | |
| B05D 5/04 | (2006.01) | |
| H05K 3/12 | (2006.01) | |
| B05D 5/12 | (2006.01) | |

(52) U.S. Cl.
CPC .............. B05D 3/002 (2013.01); B05D 3/007
(2013.01); B05D 3/02 (2013.01); B05D 5/04
(2013.01); B05D 5/12 (2013.01); B29C 41/08
(2013.01); B29C 41/12 (2013.01); B29C 41/14
(2013.01); B29C 41/36 (2013.01); B29K
2105/0073 (2013.01); B29L 2031/756
(2013.01); H05K 3/12 (2013.01)

(56) References Cited

U.S. PATENT DOCUMENTS

| | | | | |
|---|---|---|---|---|
| 2007/0284557 A1* | 12/2007 | Gruner | .................. | B82Y 40/00 |
| | | | | 252/500 |
| 2008/0143906 A1* | 6/2008 | Allemand | .............. | B82Y 10/00 |
| | | | | 349/43 |
| 2009/0081113 A1 | 3/2009 | Jang et al. | | |
| 2009/0218260 A1 | 9/2009 | Chow et al. | | |
| 2010/0101829 A1 | 4/2010 | Verhaverbeke et al. | | |
| 2010/0101830 A1 | 4/2010 | Nalamasu et al. | | |
| 2010/0101832 A1 | 4/2010 | Verhaverbeke et al. | | |
| 2010/0203454 A1* | 8/2010 | Brongersma | ....... | C23C 14/0688 |
| | | | | 430/311 |
| 2011/0011773 A1 | 1/2011 | Strano et al. | | |
| 2011/0156577 A1* | 6/2011 | Koyama | .................. | H01B 1/22 |
| | | | | 313/504 |
| 2011/0183067 A1 | 7/2011 | Jhung et al. | | |
| 2013/0342221 A1* | 12/2013 | Virkar | .................... | G06F 3/041 |
| | | | | 324/661 |
| 2015/0316955 A1* | 11/2015 | Dodds | ..................... | G06F 3/041 |
| | | | | 345/173 |
| 2015/0318070 A1* | 11/2015 | Gunasekaran | ........ | C03C 17/009 |
| | | | | 252/510 |
| 2016/0027935 A1* | 1/2016 | Naito | .................. | H01L 31/1884 |
| | | | | 438/98 |

FOREIGN PATENT DOCUMENTS

| | | | |
|---|---|---|---|
| KR | 10-2013-0013689 A | | 2/2013 |
| KR | 10-2013-0037483 | * | 4/2013 |
| WO | WO2011/037388 | * | 3/2011 |

OTHER PUBLICATIONS

D.I. Son et al., "Flexible Organic Bistable Devices Based on Graphene Embedded in an Insulating Ploly{methyl methacrylate) Polymer Layer," Nano Letters, May 26, 2010, pp. 2441-2447, vol. 10.

P.A.Smith et al., "Electric-Field Assisted Assembly and Alignment of Metallic Nano Wires," APL, Aug. 28, 2000, pp. 1399-1401, vol. 77, No. 9.

PCT International Search Report, PCT/KR2014/011989, dated Mar. 9, 2015, 4 Pages.

X.Q. Chen et al.,"Aligning Sing-Wall Carbon Nano Tubes with an Alternating-Current Electric Field," APL, Jun. 4, 2001, pp. 3714-3716, vol. 78, No. 23.

U.S. Office Action, U.S. Appl. No. 15/102,831, filed Apr. 26, 2018, 11 pages.

U.S. Office Action, U.S. Appl. No. 15/102,831, filed Oct. 16, 2017, eight pages.

* cited by examiner

[Figure 1]
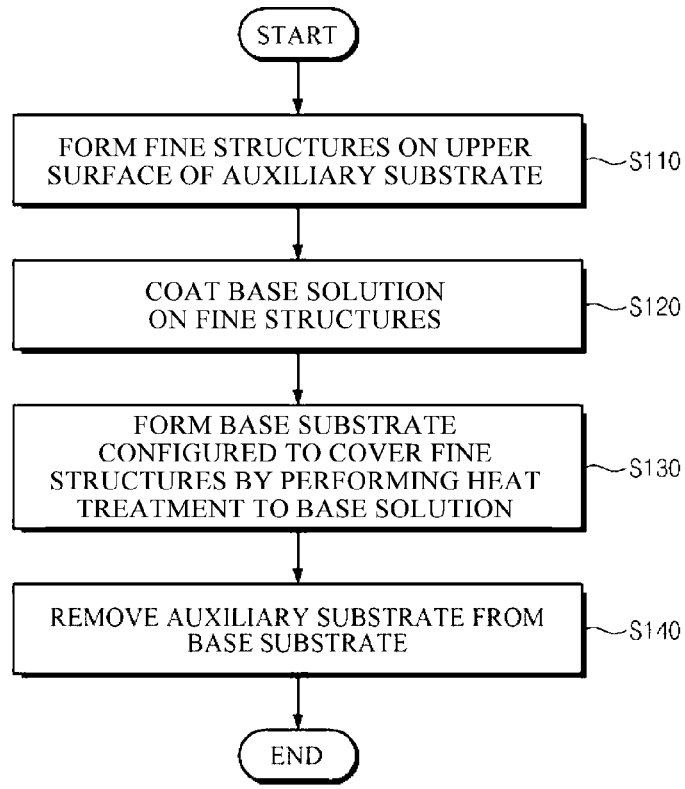
[Figure 2a]
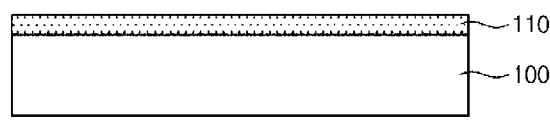
[Figure 2b]
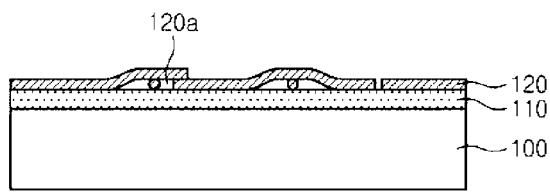

【Figure 2c】
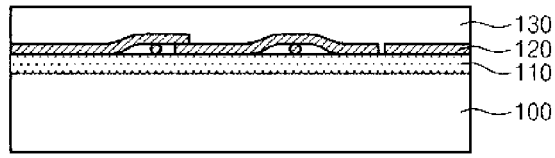
【Figure 2d】
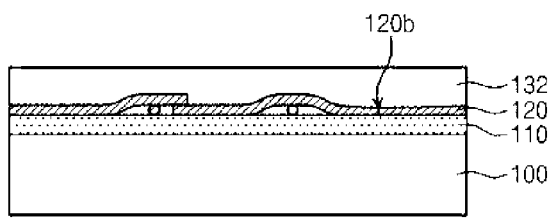
【Figure 2e】
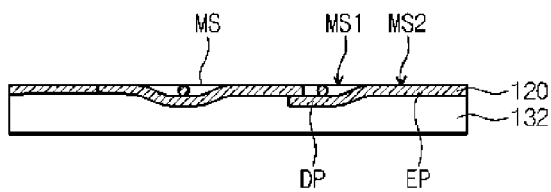
【Figure 2f】
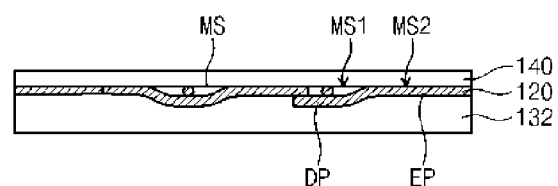
【Figure 3a】
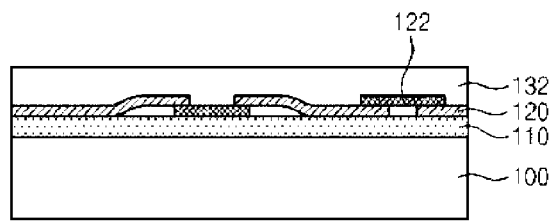

【Figure 3b】
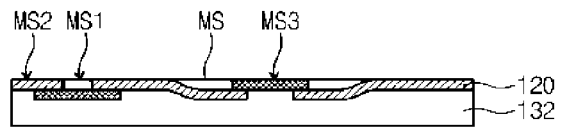
【Figure 4】
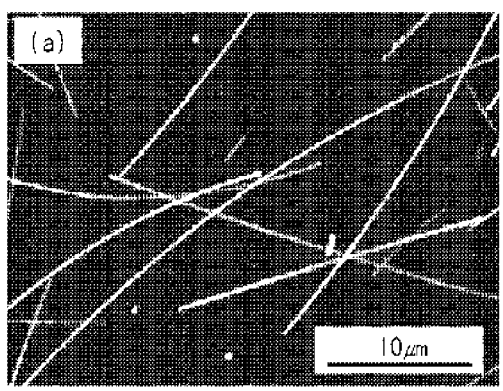
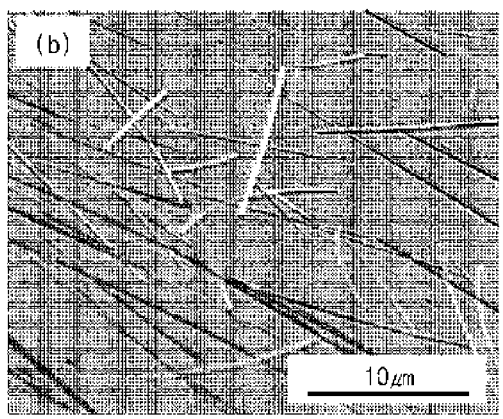

[Figure 5]
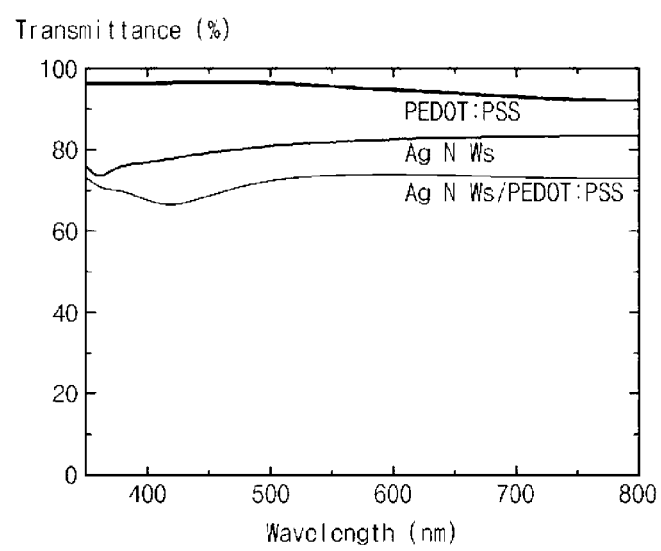

[Figure 6]
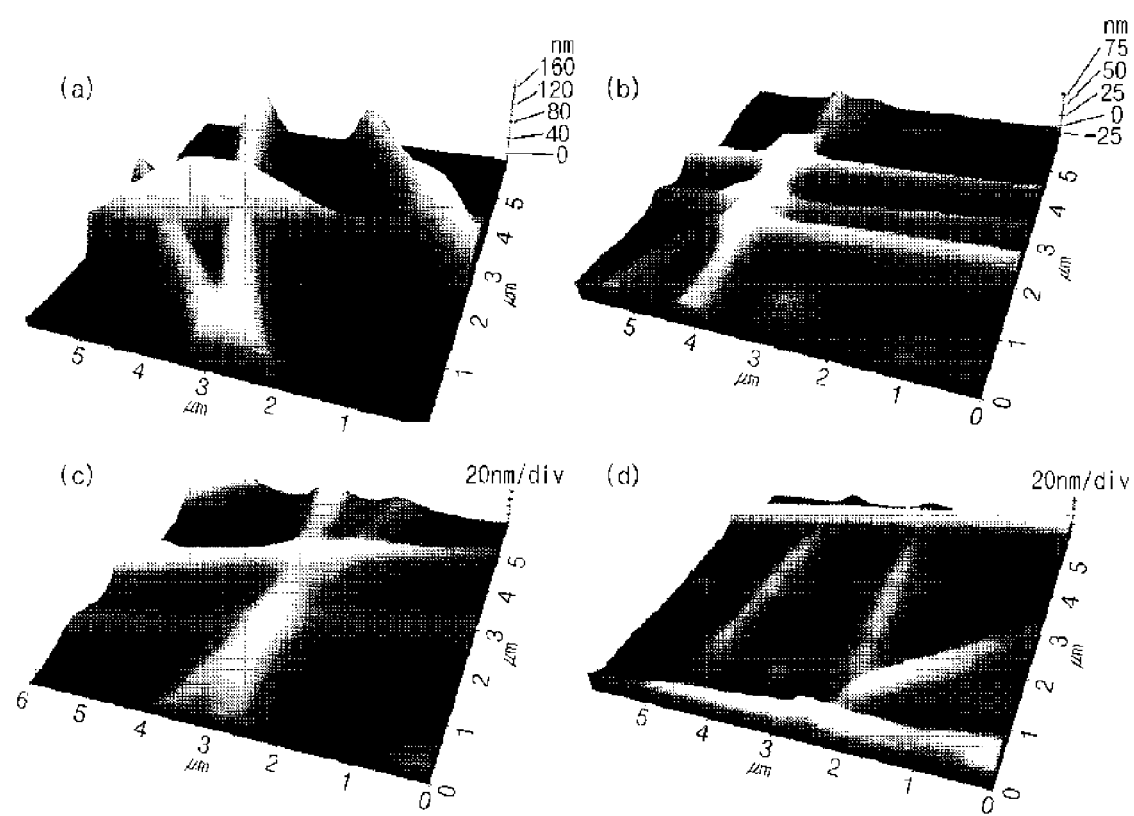

【Figure 7】
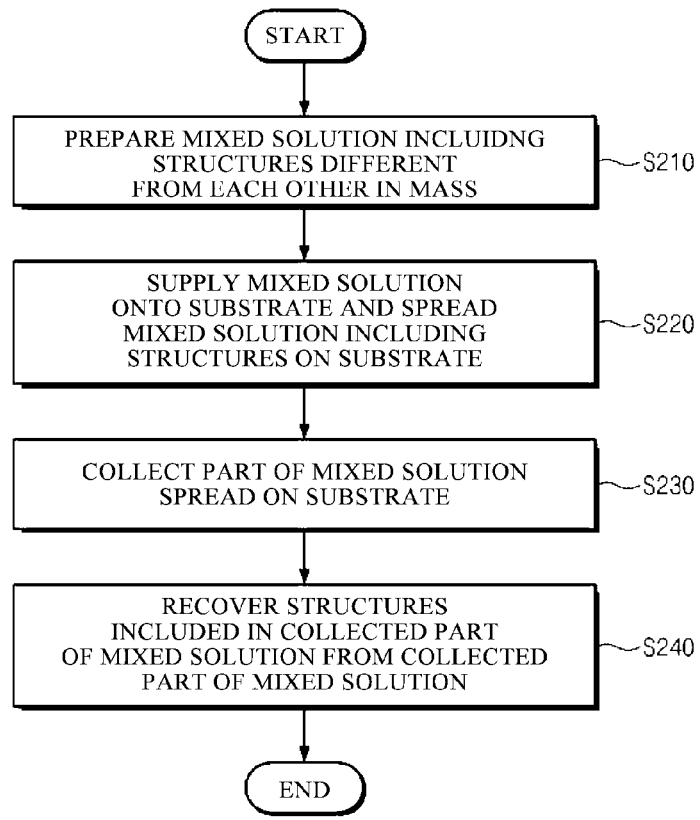
【Figure 8】
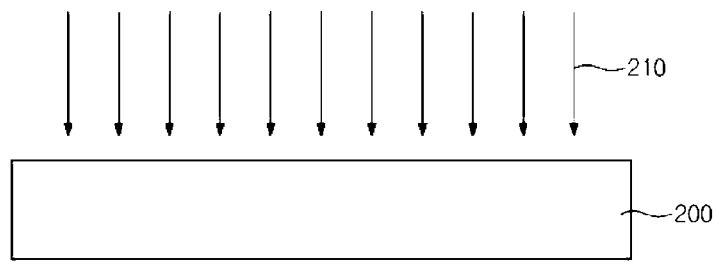

[Figure 9]
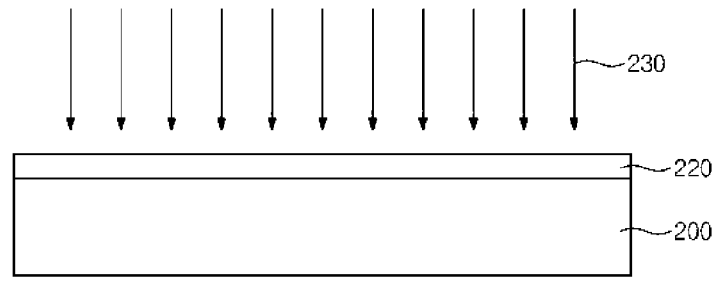
[Figure 10]
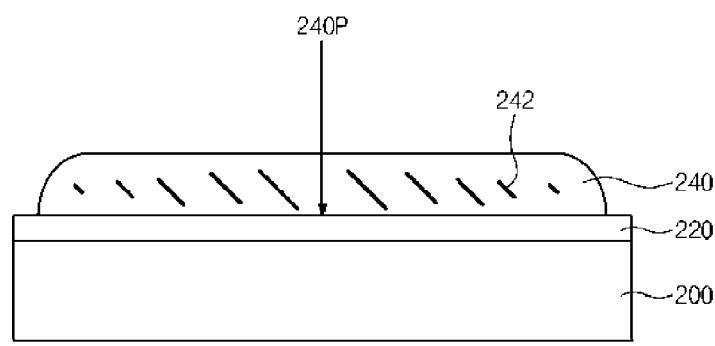
[Figure 11]
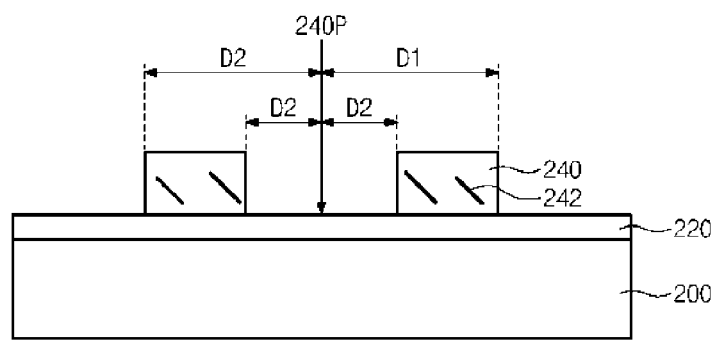

[Figure 12]
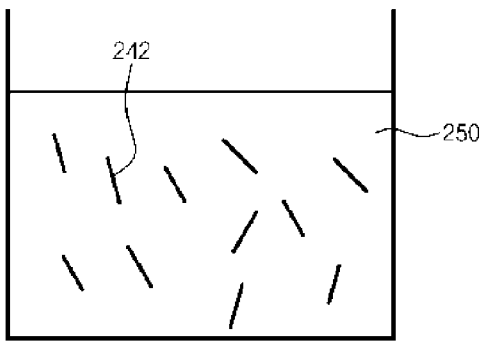
[Figure 13]
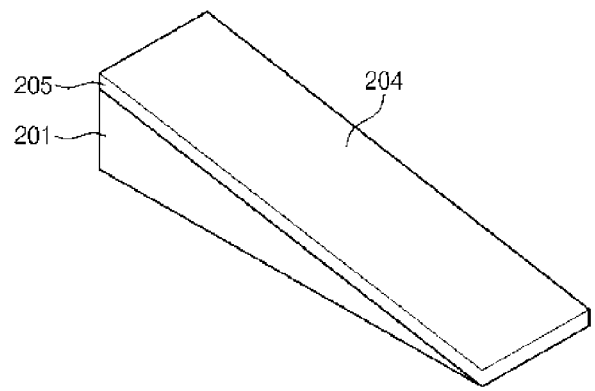
[Figure 14]
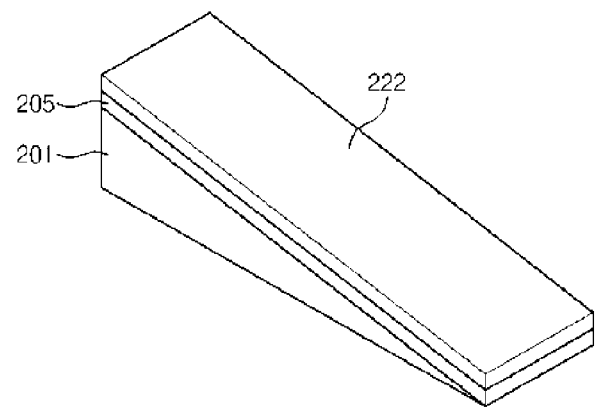

[Figure 15]
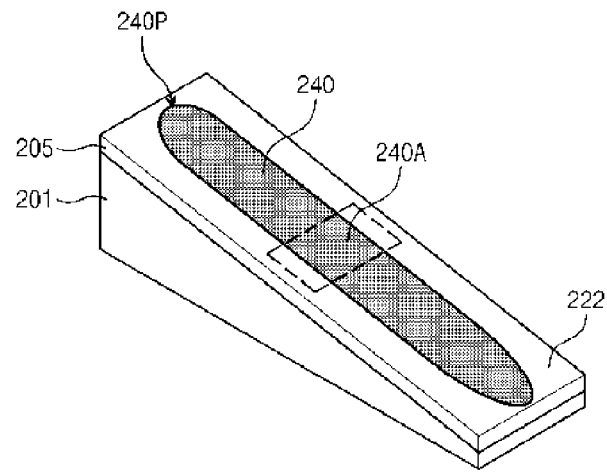
[Figure 16]
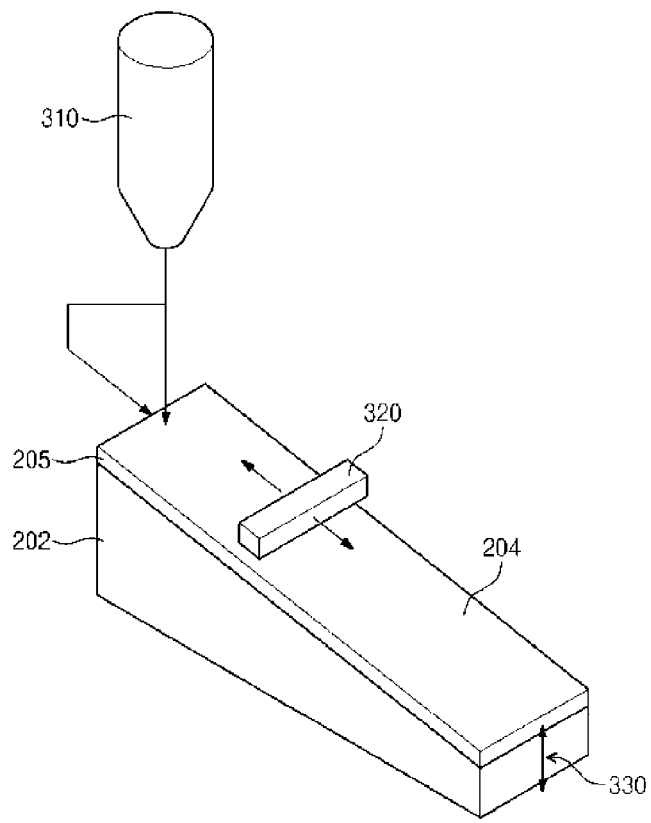

【Figure 17】
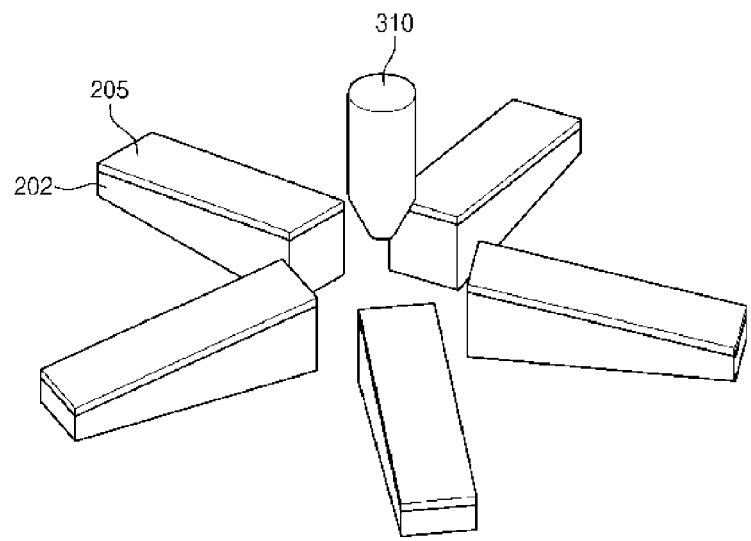
【Figure 18】
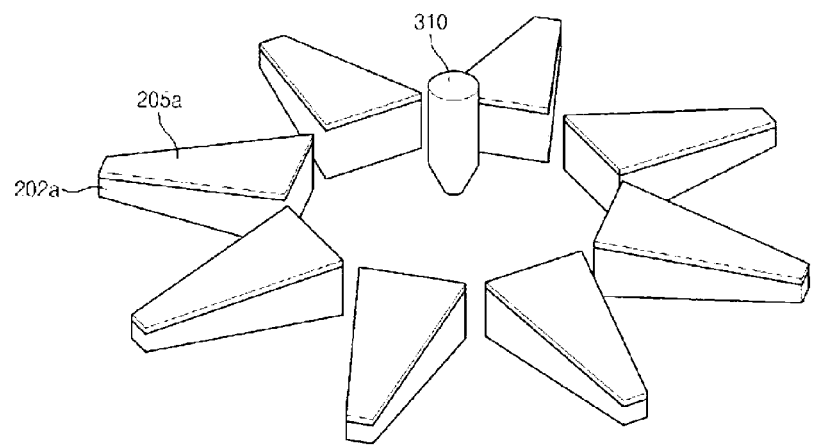

[Figure 19]
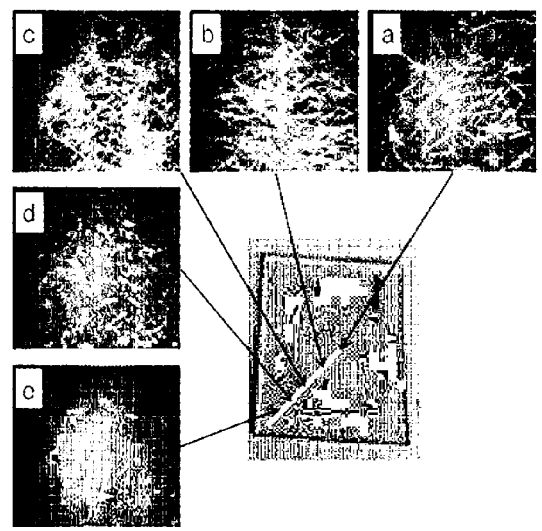
[Figure 20]
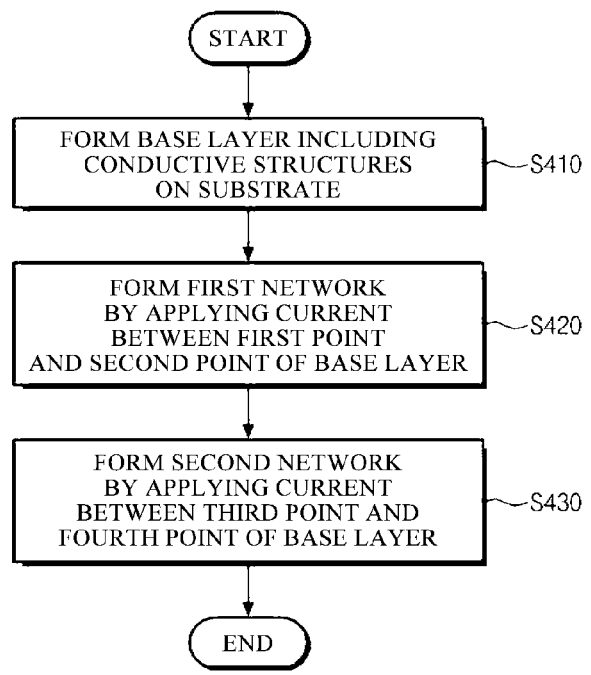

【Figure 21】
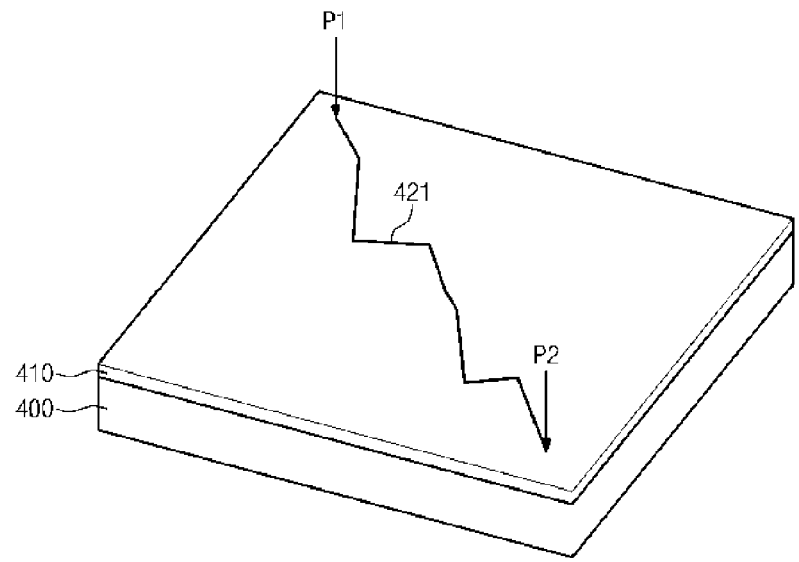
【Figure 22】
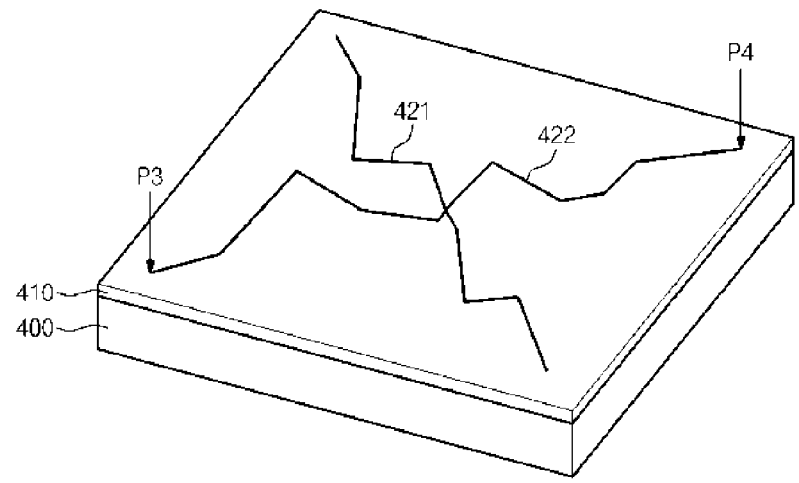

[Figure 23]
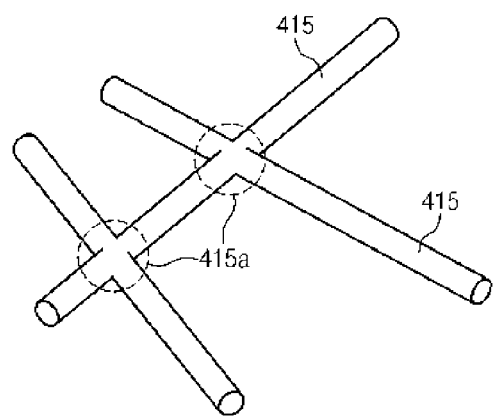
[Figure 24]
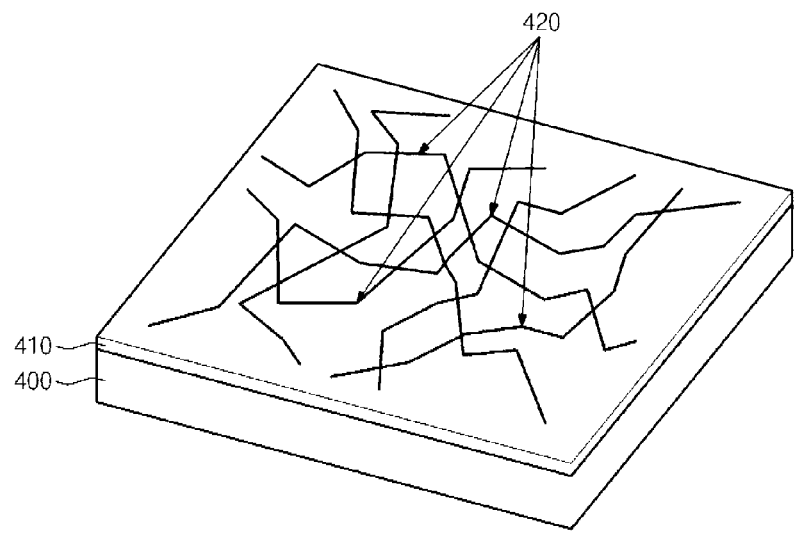

[Figure 25]
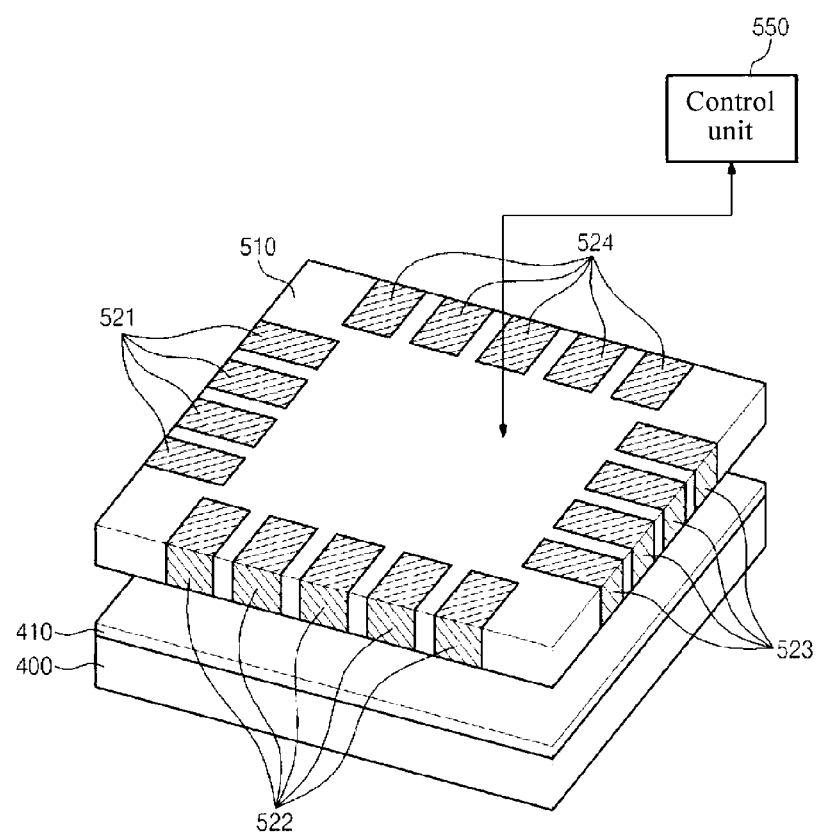

[Figure 26]
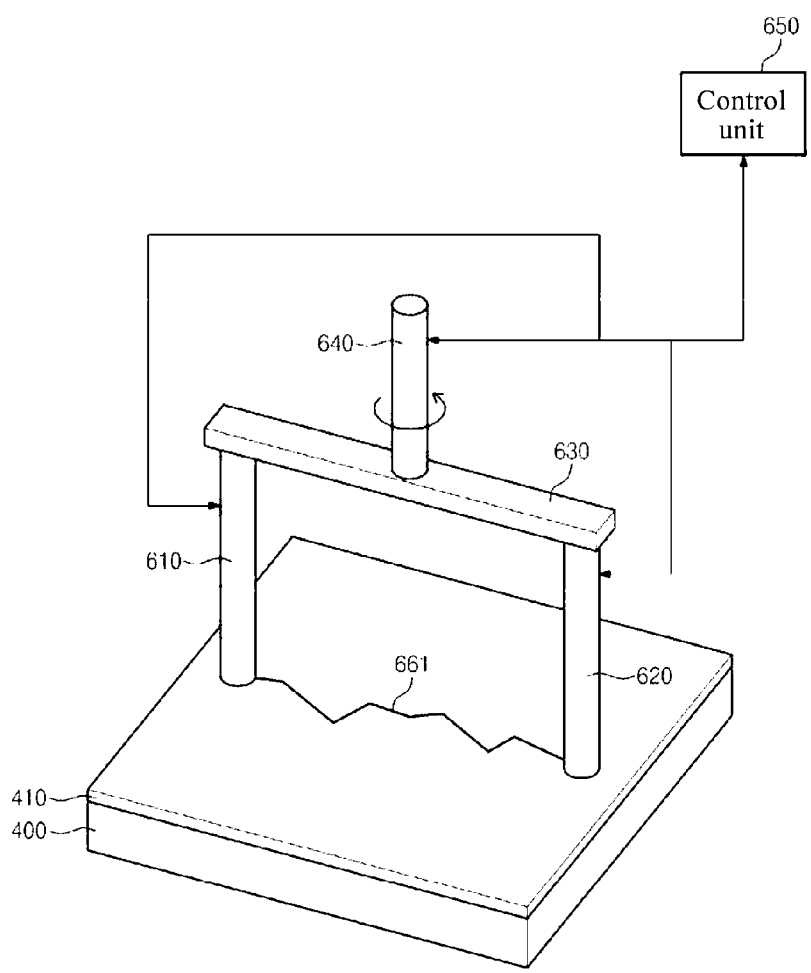

[Figure 27]
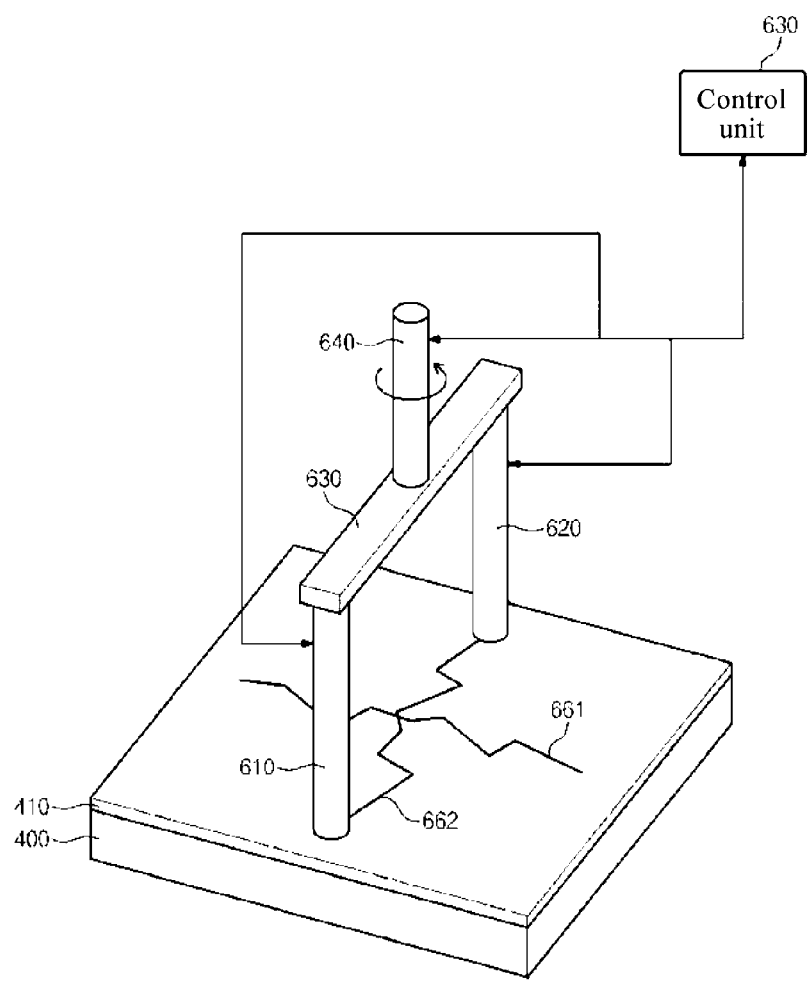

SUBSTRATE INCLUDING NANO/MICRO STRUCTURE, METHOD FOR MANUFACTURING THE SAME, METHOD FOR REFINING NANO/MICRO STRUCTURE, METHOD FOR MANUFACTURING NANO/MICRO STRUCTURE NETWORK, AND MANUFACTURING APPARATUS THEREFOR

TECHNICAL FIELD

The present disclosure relates to a substrate including nano/micro structures, a method for manufacturing the same, a method for refining a nano/micro structure, a method for manufacturing a nano/micro structure network, and a manufacturing apparatus therefor.

BACKGROUND ART

A micro/nano structure having a size of several nm to several hundred nm is manipulated and controlled in nano scale. Thus, new physical/chemical properties different from those of existing materials can be expected. Therefore, the micro/nano structure has been attracting a lot of attention as a next-generation material which can overcome the limitations of the existing materials.

Such a micro/nano structure is one type of core new material that provides a foundation for use in technologies of various fields such as organic light emitting elements, liquid crystal displays, touch panels, or solar cells. Generally, a micro/nano structure is manufactured to various sizes by a chemical method, and micro/nano structures are coated on a substrate by bar coating, spray coating, spin coating, dip coating, brush coating, gravure coating, or the like. Various techniques for manufacturing a substrate including micro/nano structures with excellent properties have been developed.

For example, Korean Patent Laid-open Publication No. 10-2013-0037483 (Application No. 10-2011-0101907) discloses a method for manufacturing a conductive film by forming a one-dimensional conductive nanomaterial including any one selected from a carbon nanotube, a metal nano wire, and a metal nano rod and forming a two-dimensional nanomaterial including any one selected from graphene, boronitride, and tungsten oxide on an upper surface of the one-dimensional conductive nanomaterial.

Meanwhile, if micro/nano structures having different sizes are used in a transparent electrode or the like, conductivity and transmittance are decreased and haze is increased. Accordingly, various techniques for manufacturing uniform-sized micro nano structures have been developed.

For example, Korean Patent Laid-open Publication No. 10-2013-0072956 (Application No. 10-2011-0140589) discloses a method for forming a metal nano wire by allowing a reaction solution to pass through a filter having a pore size of 5 μm to 10 μm.

Further, various techniques for reducing a resistance of a micro/nano structure network have been developed. Particularly, as for a silver nano wire, there has been suggested a method of performing a heat treatment, an acid steam treatment, and a graphene oxide treatment after coating. However, such methods have a problem of damaging micro/nano structures or a substrate on which the micro/nano structure are disposed.

DETAILED DESCRIPTION OF THE INVENTION

Technical Problem

An object to be achieved by the present disclosure is to provide a substrate including nano/micro structures with a minimized surface roughness and a method for manufacturing the same.

Another object to be achieved by the present disclosure is to provide a substrate including nano/micro structures with high reliability and a method for manufacturing the same.

Yet another object to be achieved by the present disclosure is to provide a substrate including flexible nano/micro structures and a method for manufacturing the same.

Still another object to be achieved by the present disclosure is to provide a substrate including transparent and conductive nano/micro structures and a method for manufacturing the same.

Still another object to be achieved by the present disclosure is to provide a refining method and a refining apparatus for a nano/micro structure with high reliability.

Still another object to be achieved by the present disclosure is to provide a refining method and a refining apparatus for nano/micro structures having substantially the same size.

Still another object to be achieved by the present disclosure is to provide a refining method and a refining apparatus for a nano/micro structure which can be simply manufactured.

Still another object to be achieved by the present disclosure is to provide a refining method and a refining apparatus for a nano/micro structure which can be improved in production yield.

Still another object to be achieved by the present disclosure is to provide a refining method and a refining apparatus for a nano/micro structure applicable to a continuous process.

An object to be achieved by the present disclosure is to provide a manufacturing method and a manufacturing apparatus for a nano/micro structure network which can have a substantially uniform sheet resistance.

Another object to be achieved by the present disclosure is to provide a manufacturing method and a manufacturing apparatus for a nano/micro structure network with a minimized resistance.

Yet another object to be achieved by the present disclosure is to provide a manufacturing method and a manufacturing apparatus for a nano/micro structure with minimized damage to a substrate.

The objects to be achieved by the present disclosure are not limited to the above-described objects.

Technical Solution

In order to achieve the above-described aspects, the present disclosure provides a method for manufacturing a substrate including nano/micro structures.

According to an exemplary embodiment, the method for manufacturing a substrate including nano/micro structures includes: forming nano/micro structures on an upper surface of an auxiliary substrate; coating a base solution on the nano/micro structures; forming a base substrate configured to cover the nano/micro structures by performing a heat treatment to the base solution; and removing the auxiliary substrate from the base substrate.

According to an exemplary embodiment, during the heat treatment to the base solution, at least parts of the nano/micro structures may be fused and bonded to each other.

According to an exemplary embodiment, there is a gap between the nano/micro structures and the auxiliary substrate, and the base solution fills the gap.

According to an exemplary embodiment, the nano/micro structures are disposed within the base substrate.

According to an exemplary embodiment, the method for manufacturing a substrate including nano/micro structures may further include: performing a pretreatment process for reducing surface energy of the upper surface of the auxiliary substrate before forming the nano/micro structures on the auxiliary substrate.

According to an exemplary embodiment, the method for manufacturing a substrate including nano/micro structures may further include: at least one of performing a heat treatment to the auxiliary substrate on which the nano/micro structures are formed before coating the base solution and performing a heat treatment to the base substrate after separating the auxiliary substrate.

According to an exemplary embodiment, the method for manufacturing a substrate including nano/micro structures may further include: forming a releasing layer on the upper surface of the auxiliary substrate before forming the nano/micro structures. The nano/micro structures are formed on the releasing layer, and the separating of the auxiliary substrate from the base substrate may include removing the releasing layer.

According to an exemplary embodiment, the auxiliary substrate is removed from the base substrate to expose a main surface of the base substrate adjacent to the upper surface of the auxiliary substrate.

According to an exemplary embodiment, the main surface of the base substrate may include a portion including the nano/micro structures and a portion including the base substrate.

According to an exemplary embodiment, the method for manufacturing a substrate including nano/micro structures may further include: forming a conductive film on the main surface of the base substrate.

In order to achieve the above-described aspects, the present disclosure provides a method for manufacturing an electronic element.

According to an exemplary embodiment, the method for manufacturing an electronic element may further include: manufacturing the substrate including nano/micro structures according to the above-described exemplary embodiments; and forming a semiconductor element on the main surface of the base substrate.

In order to achieve the above-described aspects, the present disclosure provides a substrate including nano/micro structures.

According to an exemplary embodiment, the substrate including nano/micro structures includes a base substrate including a flat main surface and nano/micro structures disposed within the base substrate so as to be adjacent to the main surface. The main surface of the base substrate may include a first portion including the base substrate and a second portion including the nano/micro structures.

According to an exemplary embodiment, the base substrate includes a counter surface facing the main surface, and the nano/micro structures are disposed within the base substrate and located relatively closer to the main surface than to the counter surface.

According to an exemplary embodiment, the nano/micro structures include an exposed portion constituting the main surface and a dent portion located under the main surface. The dent portion is covered by the first portion of the main surface.

In order to achieve the above-described aspects, the present disclosure provides a method for refining a nano/micro structure.

According to an exemplary embodiment, the method for refining a nano/micro structure may include: preparing a mixed solution including structures different from each other in mass; spreading the mixed solution including the structures on a substrate by supplying the mixed solution onto the substrate; collecting a part of the mixed solution spread on the substrate; and recovering the structures included in the collected part of the mixed solution from the collected part of the mixed solution.

According to an exemplary embodiment, the structures may be silver nano structures.

According to an exemplary embodiment, the substrate is inclined to the ground.

According to an exemplary embodiment, the collected part of the mixed solution is located within a predetermined distance range from a location at which the mixed solution is supplied to the substrate.

According to an exemplary embodiment, the collecting of the part of the mixed solution may include: removing the mixed solution spread on the substrate except the part of the mixed solution; and collecting the remaining part of the mixed solution.

According to an exemplary embodiment, the spreading of the mixed solution may include: drying the mixed solution, and the collecting of the part of the mixed solution may include: collecting the part of the dried mixed solution.

According to an exemplary embodiment, the collecting of the part of the mixed solution may include: supplying a solution that dissolves the part of the dried mixed solution onto the substrate.

According to an exemplary embodiment, the recovering of the structures may include: recovering the structures from the solution in which the part of the mixed solution is dissolved, with a centrifuge.

According to an exemplary embodiment, the method for refining a nano/micro structure may further include: forming a peeling layer on the substrate before supplying the mixed solution onto the substrate.

According to an exemplary embodiment, the peeling layer is dissolved by the solution.

According to an exemplary embodiment, the method for refining a nano/micro structure may further include: performing a pretreatment process for reducing surface energy of a surface of the substrate before supplying the mixed solution onto the substrate.

In order to achieve the above-described aspects, the present disclosure provides a refining apparatus for a nano/micro structure.

According to an exemplary embodiment, the refining apparatus for a nano/micro structure may include: a substrate including an upper surface inclined to the ground; and a mixed solution supply unit configured to supply a mixed solution including structures different from each other in mass to the upper surface of the substrate. The structures having relatively small mass are spread farther from a location where the mixed solution is supplied to the upper surface of the substrate than the structures having relatively great mass.

According to an exemplary embodiment, the refining apparatus for a nano/micro structure may further include an inclination adjusting unit configured to adjust an inclination between the upper surface of the substrate and the ground.

According to an exemplary embodiment, the refining apparatus for a nano/micro structure may further include a substrate pretreatment supply unit configured to supply plasma to the upper surface of the substrate.

According to an exemplary embodiment, the mixed solution supply unit may supply the mixed solution including the structures to a part of the upper surface of the substrate placed at a relatively high location from the ground.

According to an exemplary embodiment, the substrate may be provided plural in number and upper surfaces of the plurality of substrates may be inclined to the ground. Parts of the upper surfaces of the plurality of substrates placed at a relatively high location from the ground may be disposed to be adjacent to each other.

According to an exemplary embodiment, the upper surfaces of the plurality of substrates may be increased in size as being closer to the ground.

In order to achieve the above-described aspects, the present disclosure provides a method for manufacturing a nano/micro structure network.

According to an exemplary embodiment, the method for manufacturing a nano/micro structure network may include: forming a base layer including conductive structures on a substrate; forming a first network in which a first point of the base layer and a second point separated from the first point are electrically connected by the structures by applying a current between the first point and the second point; and forming a second network in which a third point of the base layer and a fourth point separated from the third point are electrically connected by the structures by applying a current between the third point and the fourth point.

According to an exemplary embodiment, the structures may include silver nano structures.

According to an exemplary embodiment, at least parts of the structures are bonded to each other by the current applied between the first point and the second point and the current applied between the third point and the fourth point.

According to an exemplary embodiment, the first to fourth points are located at edges of the base layer.

According to an exemplary embodiment, the current applied between the first point and the second point and the current applied between the third point and the fourth point respectively have current paths different from each other.

According to an exemplary embodiment, the current applied between the first point and the second point corresponds to the first network and the current applied between the third point and the fourth point corresponds to the second network.

In order to achieve the above-described aspects, the present disclosure provides a manufacturing apparatus for a nano/micro structure network.

According to an exemplary embodiment, the manufacturing apparatus for a nano/micro structure network may include: a first electrode and a second electrode extended in a first direction and separated from each other; a support rod configured to connect one end of the first electrode to one end of the second electrode; a rotation rod configured to be rotated around the first direction as a rotation axis and connected to the support rod; and a control unit configured to rotate the rotation rod after applying a current between the first electrode and the second electrode, and apply a current between the first electrode and the second electrode after rotating the rotation rod.

According to an exemplary embodiment, even when the rotation rod is rotated, a distance between the first electrode and the second electrode is uniformly maintained.

According to an exemplary embodiment, in a state where the first electrode and the second electrode are in contact with a first point of a base layer including conductive structures and a second point separated from the first point, respectively, a current is applied between the first electrode and the second electrode and the first electrode and the second electrode are rotated by the rotation rod, and in a state where the first electrode and the second electrode are in contact with a third point of the base layer and a fourth point separated from the third point, respectively, a current is applied between the first electrode and the second electrode.

According to an exemplary embodiment, the manufacturing apparatus for a nano/micro structure network may include: a support structure; a plurality of electrodes disposed adjacent to edges of the support structure; and a control unit configured to apply a current between a first electrode and a second electrode selected from the plurality of electrodes, and apply a current between a third electrode and a fourth electrode selected from the electrodes other than the first electrode and the second electrode among the plurality of electrodes after applying the current between the first electrode and the second electrode.

According to an exemplary embodiment, in a state where the plurality of electrodes including the first to fourth electrodes is in contact with the base layer including the conductive structures, a current is applied between the first electrode and the second electrode and between the third electrode and the fourth electrode.

According to an exemplary embodiment, the support structure includes first to fourth sides, and the plurality of electrodes is disposed along the first to fourth sides, respectively. The electrodes disposed along the first to fourth sides constitute first to fourth groups, respectively.

According to an exemplary embodiment, the first electrode and the second electrode are respectively included in different groups, and the third electrode and the fourth electrode are respectively included in different groups.

Advantageous Effects

According to a substrate including nano/micro structures and a method for manufacturing the same in accordance with an exemplary embodiment of the present disclosure, a base solution is coated on nano/micro structures formed on an auxiliary substrate, and a base substrate is formed by performing a heat treatment to the base solution. The auxiliary substrate is removed from the base substrate, so that a main surface of the base substrate adjacent to the auxiliary substrate is exposed. The main surface of the base substrate includes a portion including the nano/micro structures and may be substantially flat. Accordingly, it is possible to provide a substrate including nano/micro structures with a minimized surface roughness.

Further, according to a refining method and a refining apparatus for a nano/micro structure in accordance with an exemplary embodiment of the present disclosure, a mixed solution including structures different from each other in mass and/or size is supplied and spread on a substrate and only a part of the mixed solution is collected within a predetermined distance range from a location at which the mixed solution is supplied to the substrate. Structures having substantially the same mass and/or size can be refined from the collected part of the mixed solution.

Furthermore, according to a manufacturing method and a manufacturing apparatus for a nano/micro structure network in accordance with an exemplary embodiment of the present disclosure, a plurality of current paths different from each other is provided to a base layer disposed on a substrate and including conductive structures, so that a plurality of networks in which the structures are electrically connected may be formed. Accordingly, it is possible to provide a manufacturing method and a manufacturing apparatus for a nano/micro structure network with minimize damage to the substrate, a minimized resistance of the base layer, and substantially uniform sheet resistance.

DESCRIPTION OF DRAWINGS

FIG. 1 is a flowchart provided to explain a method for manufacturing a substrate including nano/micro structures according to an exemplary embodiment of the present disclosure.

FIG. 2A through FIG. 2F are diagrams provided to explain a substrate including nano/micro structures and a method for manufacturing the same according to an exemplary embodiment of the present disclosure.

FIG. 3A and FIG. 3B are diagrams provided to explain a modification example of a metal nano wire substrate and a method for manufacturing the same according to an exemplary embodiment of the present disclosure.

FIG. 4 is an SEM image of a substrate including nano/micro structures according to an exemplary embodiment of the present disclosure.

FIG. 5 is a graph provided to explain a transmittance of a substrate including nano/micro structures according to an exemplary embodiment of the present disclosure.

FIG. 6 is an atomic force microscopic image provided to explain a surface roughness of a substrate including nano/micro structures according to an exemplary embodiment of the present disclosure.

FIG. 7 through FIG. 11 are diagrams provided to explain a method for refining a nano/micro structure according to an exemplary embodiment of the present disclosure.

FIG. 12 is a flowchart provided to explain a method for refining a nano/micro structure according to an exemplary embodiment of the present disclosure.

FIG. 13 through FIG. 15 are diagrams provided to explain a method for refining a nano/micro structure according to another exemplary embodiment of the present disclosure.

FIG. 16 is a diagram provided to explain a refining apparatus for a nano/micro structure according to an exemplary embodiment of the present disclosure.

FIG. 17 is a diagram provided to explain a refining apparatus for a nano/micro structure according to another exemplary embodiment of the present disclosure.

FIG. 18 is a diagram provided to explain a refining apparatus for a nano/micro structure according to yet another exemplary embodiment of the present disclosure.

FIG. 19 is a microscopic image of a spread experiment of structures according to a method for refining a nano/micro structure in accordance with an exemplary embodiment of the present disclosure.

FIG. 20 is a flowchart provided to explain a method for manufacturing a nano/micro structure network according to an exemplary embodiment of the present disclosure.

FIG. 21 through FIG. 23 are perspective views provided to explain a method for manufacturing a nano/micro structure network according to an exemplary embodiment of the present disclosure.

FIG. 24 is a diagram provided to explain a network formed between contact points of structures according to a method for manufacturing a nano/micro structure network in accordance with an exemplary embodiment of the present disclosure.

FIG. 25 is a diagram provided to explain a manufacturing apparatus for a nano/micro structure network according to an exemplary embodiment of the present disclosure.

FIG. 26 and FIG. 27 are diagrams provided to explain a manufacturing apparatus for a nano/micro structure network according to another exemplary embodiment of the present disclosure.

DETAILED DESCRIPTION OF EXEMPLARY EMBODIMENTS

Hereinafter, exemplary embodiments of the present disclosure will be described in detail with reference to the accompanying drawings. However, the technical concept of the present disclosure is not limited to the exemplary embodiments described herein, but can be embodied in various forms. The exemplary embodiments described herein are provided to complete disclosure of the present disclosure and convey the concept of the present disclosure to a person having ordinary skill in the art.

In the present specification, in case where it is described that one element is on the other element, the one element may be directly formed on the other element or a third element may be intervened between them. Further, in the drawings, thicknesses of layers and areas are exaggerated for effective explanation of technical matters.

Although the terms "first", "second", "third", and the like are used for describing various components in various exemplary embodiments, these components are not confined by these terms. These terms are merely used for distinguishing one component from the other components. Therefore, a first component mentioned in any one exemplary embodiment may be mentioned as a second component in another exemplary embodiment. Each exemplary embodiment described and illustrated herein includes complementary exemplary embodiments thereof. Further, in the present specification, the term "and/or" is used to mean at least one of the associated listed components is included.

A singular expression used herein includes a plural expression unless it is clearly construed in a different way in the context. The terms used herein, such as "including" or "having", are used only to designate the features, numbers, steps, operations, constituent elements, or combinations thereof described in the specification, but should not be construed to exclude existence or addition of one or more other features, numbers, steps, operations, constituent elements, or combinations thereof. Further, the term "connection" used herein includes indirect connection and direction connection of a plurality of components.

Further, in the following description, a detailed explanation of well-known related functions or configurations may be omitted to avoid unnecessarily obscuring the subject matter of the present disclosure.

Furthermore, the term "nano/micro structure" used herein includes a wire, a rod, fiber, a line, a flake, a particle, or the like, and a minute structure having a micro size or a nano size.

A substrate including nano/micro structures and a method for manufacturing the same according to an exemplary embodiment of the present disclosure will be described.

FIG. 1 is a flowchart provided to explain a method for manufacturing a substrate including nano/micro structures according to an exemplary embodiment of the present disclosure, and FIG. 2A through FIG. 2F are diagrams provided to explain a substrate including nano/micro structures and a method for manufacturing the same according to an exemplary embodiment of the present disclosure.

Referring to FIG. 2A, an auxiliary substrate 100 is prepared. The auxiliary substrate 100 may include a flat upper surface. The auxiliary substrate 100 may be a flexible substrate. The auxiliary substrate 100 may be any one of a glass substrate, a silicon semiconductor substrate, a compound semiconductor substrate, or a polymer substrate. For example, the auxiliary substrate 100 may be any one of a PET substrate, a PC substrate, a PEN substrate, a PMMA substrate, a PU substrate, or a PI substrate.

A releasing layer 110 may be formed on the auxiliary substrate 100. The releasing layer 110 may be configured to easily remove the auxiliary substrate 100 from a base substrate to be described later. For example, the releasing layer 110 may be formed using a silicon-based release agent or a fluorine-based release agent.

Referring to FIG. 1 and FIG. 2B, nano/micro structures 120 may be formed on the upper surface of the auxiliary substrate 100 (S110). According to an exemplary embodiment, the nano/micro structures 120 may be formed of a conductive material. For example, the nano/micro structures 120 may be silver (Ag) nano wires. The nano/micro structures 120 may be formed by various methods such as bar coating, spin coating, spray coating, dip coating, brush coating, or gravure coating.

Before the nano/micro structures 120 are formed, a pretreatment process for reducing surface energy of the upper surface of the auxiliary substrate 100 and/or an upper surface of the releasing layer 110 may be performed to easily disperse the nano/micro structures 120 on the upper surface of the auxiliary substrate 100. For example, a plasma process using a gas such as oxygen, argon, nitrogen, or hydrogen may be performed, or a UV or ozone process may be performed.

After the nano/micro structures 120 are formed, the auxiliary substrate 100 on which the nano/micro structures 120 are formed may be dried to remove a solvent supplied onto the auxiliary substrate 100 while the nano/micro structures 120 are formed. For example, the auxiliary substrate 100 may be dried at a temperature of 60° C. to 80° C.

After the nano/micro structures 120 are formed, a heat treatment process may be performed. The conductivity of the nano/micro structures 120 may be improved by the heat treatment process. For example, the heat treatment process may be performed at 160° C. to 180° C.

A gap 120a may be present between the nano/micro structures 120 and the releasing layer 110 or between the nano/micro structures 120 and the auxiliary substrate 100 if the formation process of the releasing layer 110 is omitted.

Referring to FIG. 1 and FIG. 2C, a base solution 130 may be coated on the nano/micro structures 120 (S120). The base solution 130 may be in a solution state and may include a material of a flexible substrate. For example, the base solution 130 may include at least any one of polyethylene terephthalate (PET), polyethylene naphthalate (PEN), polycarbonate (PC), polyether sulfone (PES), polyimide (PI), poly(methylmethacrylate) (PMMA), or acrylite.

The base solution 130 may be formed by various methods such as bar coating, spin coating, spray coating, dip coating, brush coating, or gravure coating.

According to an exemplary embodiment, before the base solution 130 is coated on the nano/micro structures 120, the nano/micro structures 120 may be patterned.

Referring to FIG. 1 and FIG. 2D, a base substrate 132 covering the nano/micro structures 120 may be formed by curing the base solution 130 through a heat treatment to the base solution 130 (S130). For example, the base solution 130 may be heat-treated at 70° C. to 300° C. More specifically, for example, if the base solution 130 is a PMMA solution, the base solution 130 may be heat-treated at 80° C. to 100° C.

While the base solution 130 is heat-treated, at least parts of the nano/micro structures 120 may be fused. Thus, parts of the nano/micro structures 120 adjacent to each other may be bonded 120b and connected to each other. Accordingly, the resistance of the nano/micro structures 120 may be reduced.

Referring to FIG. 1 and FIG. 2E, the auxiliary substrate 100 and the releasing layer 110 may be removed from the base substrate 132 (S140). The auxiliary substrate 100 and the releasing layer 110 are removed, so that a main surface MS of the base substrate 132 may be exposed to the outside.

The main surface MS of the base substrate 132 may be a surface adjacent to the upper surface of the auxiliary substrate 100. In other words, the main surface MS may be a surface in contact with the releasing layer 110 or the auxiliary substrate 100 before the auxiliary substrate 100 and the releasing layer 110 are removed. The base substrate 132 may include a counter surface facing the main surface MS.

As described above with reference to FIG. 2C, the base solution 130 is supplied onto the nano/micro structures 120 as being in a liquid state. The base solution in a liquid state may readily fill the gaps 120a between the releasing layer 110 and the nano/micro structures 120 or between the auxiliary substrate 100 and the nano/micro structures 120 if the formation process of the releasing layer 110 is omitted. Thus, the main surface MS of the base substrate 132 formed by converting the base solution 130 into a solid state through a heat treatment may become flat.

The exposed main surface MS may include a first portion MS1 including the base substrate 132 and a second portion MS2 including the nano/micro structures 120. The first portion MS1 and the second portion MS2 may constitute one flat surface. A part of the base substrate 132 constituting the first portion MS1 may be formed by performing a heat treatment to the base solution 130 filling the gap 120a.

At least parts of the nano/micro structures 120 may include an exposed portion EP and a dent portion DP. The exposed portion EP may constitute the second portion MS2 of the main surface MS. The dent portion DP may be located under the first portion MS1 of the main surface MS.

The nano/micro structures 120 may be located within the base substrate 132 so as to be relatively closer to the main surface MS than to the counter surface.

The removing of the auxiliary substrate 100 and the releasing layer 110 may include separating the auxiliary substrate 100 from the releasing layer 110 and the base substrate 132, and removing the releasing layer 110 from the base substrate 132 by dissolving the releasing layer 110 with a solvent. Otherwise, the releasing layer 110 and the auxiliary layer 100 may be removed from the base substrate 132 at the same time.

After the main surface MS is exposed by removing the auxiliary substrate 100 and the releasing layer 110, the base substrate 132 may be heat-treated. Thus, the nano/micro structures 120 weakly bonded to each other while the base substrate 132 is formed by performing a heat treatment to the base solution 130 may become strongly bonded to each other.

Referring to FIG. 2F, after the main surface MS is exposed by removing the auxiliary substrate 100 and the releasing layer 110, a conductive thin film 140 may be formed on the main surface MS. The conductive thin film 140 may include a conductive polymer (for example, PEDOT:PSS).

According to an exemplary embodiment of the present disclosure, the base substrate 132 is formed by performing a heat treatment to the base solution 130 in a liquid state on the nano/micro structures 120 formed on the auxiliary substrate 100. Thus, the main surface MS of the base substrate 132 in contact with the auxiliary substrate 100 or the releasing layer 110 may become flat although the main surface MS includes the portion including the nano/micro structures 120. Accordingly, it is possible to suppress deterioration in property of semiconductor elements, such as a thin film transistor, and an organic light emitting element, and the like formed on the main surface MS of the base substrate 132.

Generally, if metal nano wires are formed on a substrate, a surface of the substrate has a surface roughness of several hundred nm. Even if an organic/inorganic thin film is formed on the surface of the substrate on which the metal nano wires are formed, the surface has a surface roughness of about 100 nm or more. If a semiconductor element is formed on the surface of the substrate having a high surface roughness, properties of the semiconductor element may deteriorate. For example, if an organic light emitting element is formed on the surface of the substrate, there may occur non-uniformity in an internal electric field or a short circuit between an anode and a cathode. Accordingly, internal degradation of the organic light emitting element may occur, resulting in a decrease in lifetime of the organic light emitting element.

However, as described above, according to an exemplary embodiment of the present disclosure, the semiconductor elements can be formed on the substrate having the main surface MS which includes the nano/micro structures 120 and is flat, and, thus, deterioration in property of the semiconductor elements can be minimized.

In the above-described exemplary embodiment, other micro materials may be formed on the auxiliary substrate 100 in addition to the nano/micro structures 120. Details thereof will be described with reference to FIG. 3A and FIG. 3B.

FIG. 3A and FIG. 3B are diagrams provided to explain a modification example of a metal nano wire substrate and a method for manufacturing the same according to an exemplary embodiment of the present disclosure.

Referring to FIG. 3A, the auxiliary substrate 100 and the releasing layer 110 on the auxiliary substrate 100 are provided as described above with reference to FIG. 2A. The nano/micro structures 120 and a nano material 122 may be formed on the releasing layer 110. The nano material 122 may strengthen the connection between the nano/micro structures 120 and improve the dispersity of the nano/micro structures 120.

According to an exemplary embodiment, before the nano/micro structures 120 are formed on the auxiliary substrate as described above with reference to FIG. 2B, the nano material 122 is formed on the auxiliary substrate 100. After the nano material 122 is formed, the nano/micro structures 120 may be formed.

According to another exemplary embodiment unlike the above description, after the nano/micro structures 120 are formed on the auxiliary substrate 100 and before the base solution 130 is coated on the auxiliary substrate 100, the nano material 122 may be formed on the auxiliary substrate 100.

The nano material 122 may include a material different from the nano/micro structures 120. For example, the nano material 122 may include at least any one of graphene flake, single-walled CNT, double-walled CNT, multi-walled CNT, C60, C85, or C70.

The nano material 122 may be formed together with a conductive organic material on the auxiliary substrate 100. For example, the conductive organic material may include at least any one of PEDOT:PSS or PVP.

After the nano/micro structures 120 and the nano material 122 are formed on the auxiliary substrate 100, the base solution 130 may be coated on the auxiliary substrate 100 as described above with reference to FIG. 2C. After the base solution 130 is coated, the base solution 130 may be heat-treated to form the base substrate 132 as described above with reference to FIG. 2D. The base substrate 132 may cover the nano/micro structures 120 and the nano material 122.

Referring to FIG. 3B, the auxiliary substrate 100 and the releasing layer 110 may be removed from the base substrate 132 as described above with reference to FIG. 2E. Thus, the main surface MS of the base substrate 132 in contact with the releasing layer 110 (the main surface in contact with the auxiliary substrate 100 if the releasing layer 110 is omitted) may be exposed.

The exposed main surface MS may include the first portion MS1 including the base substrate 132, the second portion MS2 including the nano/micro structures 120, and a third portion MS3 including the nano material 122. The first portion MS1, the second portion MS2, and the third portion MS3 may constitute one flat surface.

As described with reference to FIG. 2F, a conductive thin film may be further formed on the main surface MS of the base substrate 132.

According to a modification example of the substrate including nano/micro structures and the method for manufacturing the same according to an exemplary embodiment of the present disclosure, the nano material 122 is formed on the auxiliary substrate 100 before or after the nano/micro structures 120 are formed. Thus, the bonding and the dispersity of the nano/micro structures can be improved.

Hereinafter, the results of a property evaluation of the substrate including nano/micro structures according to the above-described exemplary embodiments of the present disclosure will be described.

FIG. 4 is an SEM image of a substrate including nano/micro structures according to an exemplary embodiment of the present disclosure.

Referring to FIG. 4, a silver nano wire is formed on an auxiliary substrate by bar-coating, and PMMA is formed on the silver nano wire by drop-casting. FIG. 4A is an image showing a flat surface of the PMMA substrate including the silver nano wire, and FIG. 4B is an image showing an inclined surface of the PMMA including the silver nano wire.

As can be seen from FIG. 4, it is observed that silver nano wires are distributed on the PMMA substrate at an adequate density. Further, it is observed from FIG. 4B that the PMMA covers parts of silver nano wires. In other words, the PMMA covers a silver nano wires having a high surface roughness and fills a space between the silver nano wires to reduce a surface roughness.

FIG. 5 is a graph provided to explain a transmittance of a substrate including nano/micro structures according to an exemplary embodiment of the present disclosure.

Referring to FIG. 5, the transmittance of PEDOT:PSS, which is a conductive polymer used as a hole injecting layer, a silver nano wire, and a laminated structure of a silver nano wire and PEDOT:PSS were measured. As can be seen from FIG. 5, the PEDOT:PSS has the highest transmittance and the laminated structure of PEDOT:PSS on a silver nano wire has the lowest transmittance.

FIG. 6 is an atomic force microscopic image provided to explain a surface roughness of a substrate including nano/micro structures according to an exemplary embodiment of the present disclosure.

Referring to FIG. 6, according to an exemplary embodiment of the present disclosure, a silver nano wire was formed on a glass substrate, and a PMMA solution was coated on the silver nano wire and then heat-treated to form a PMMA substrate. Then, PMMA substrate including the silver nano wire was separated from the glass substrate and PEDOT:PSS was coated. A surface thereof was measured with an atomic force microscope. Further, as a comparative example of the exemplary embodiment of the present disclosure, a silver nano wire was formed on a glass substrate and PEDOT:PSS was formed on the silver nano wire. Then, a surface thereof was measured with the atomic force microscope.

FIG. 6A and FIG. 6B are atomic force microscopic images of a surface of the silver nano wire formed on the glass substrate and a surface of the laminated structure of the silver nano wire and PEDOT:PES formed on the glass substrate, respectively, according to the comparative example of the present disclosure. FIG. 6C and FIG. 6D are atomic force microscopic images of a surface of the silver nano wire transferred to the PMMA substrate and a surface of the laminated structure of PEDOT:PSS on the PMMA substrate including the silver nano wire, respectively, according to the exemplary embodiment of the present disclosure.

As can be seen from FIG. 6A, a peak-to-valley surface roughness of the silver nano wire formed on the glass substrate according to the comparative example of the present disclosure was about 210 nm. In other words, the surface roughness was about two to three times higher than 80 nm, which is the thickness of the silver nano wire, due to overlaps of silver nano wires. Further, as can be seen from FIG. 6B, a peak-to-valley surface roughness was reduced to 50 nm, i.e. about ¼, through a process of coating PEDOT:PSS on the silver nano wire formed on the glass substrate, but still had a high value.

Meanwhile, as can be seen from FIG. 6C, if the silver nano wire is transferred to the PMMA substrate according to the exemplary embodiment of the present disclosure, a peak-to-valley surface roughness was 62 nm which is considerably lower than that of FIG. 6A. Further, as can be seen from FIG. 6D, if PEDOT:PSS is coated on the PMMA substrate including the silver nano wire, a peak-to-valley surface roughness was 26 nm which is considerably lower than that of FIG. 6B, and the surface roughness was reduced by about 74% on the basis of a root-mean-square (RMS) roughness.

It is confirmed that a method of supplying a PMMA solution onto a silver nano wire disposed on a glass substrate, performing a heat treatment to the PMMA solution to form a PMMA film, removing the glass substrate and coating the PMMA film including the silver nano wire with PEDOT:PSS according to an exemplary embodiment of the present disclosure is an effective method for minimizing a surface roughness of a substrate including a silver nano wire.

A refining method and a refining apparatus for a nano/micro structure according to an exemplary embodiment of the present disclosure will be described.

FIG. 7 through FIG. 11 are diagrams provided to explain a method for refining a nano/micro structure according to an exemplary embodiment of the present disclosure, and FIG. 12 is a flowchart provided to explain a method for refining a nano/micro structure according to an exemplary embodiment of the present disclosure.

Referring to FIG. 7, a substrate 200 is provided. The substrate 200 may be a semiconductor substrate, a plastic substrate, or a glass substrate. The substrate 200 may be flexible.

A pretreatment 210 may be performed to the substrate 200. Due to the pretreatment 210 of the substrate 200, surface energy of the substrate may be reduced. According to an exemplary embodiment, the pretreatment 210 of the substrate 200 may include supplying at least any one of plasma, UV (ultra violet), or ozone to an upper surface of the substrate 200. For example, plasma using oxygen (O), argon (Ar), nitrogen (N), or hydrogen (H) gas may be supplied to the upper surface of the substrate 200.

Referring to FIG. 8, a peeling layer 220 may be coated on the upper surface of the substrate 200. As described below, the peeling layer 220 is configured to easily separate a mixed solution including structures to be formed on the peeling layer 220 from the substrate 200.

The peeling layer 220 may be coated by any one method of bar coating, spray coating, brush coating, or gravure coating. The peeling layer 220 may include a polymer material. For example, the peeling layer 220 may be formed of at least any one of polymethylmethacrylate, polyvinylpyrrolidone, polyethylene terephthalate, polystyrene, polyvinylchloride, polycarbonate, or polyimide. Otherwise, the peeling layer 220 may include a complex of the above-described polymer material and an inorganic material. For example, the inorganic material may include at least any one of Au, Si, Ag, Cu, Ni, Al, Sn, C, $SiO_2$, ZnO, $Al_2O_3$, $In_2O_3$, or $SnO_2$.

After the peeling layer 220 is coated, a heat treatment or plasma treatment 230 may be performed to the peeling layer 220. Thus, the mixed solution including the structures can be easily spread on the peeling layer 220.

Referring to FIG. 9 and FIG. 12, a mixed solution 240 including structures 242 different from each other in mass is prepared (S210). According to an exemplary embodiment, the structures 242 may be silver nano structures such as silver nano particles and silver nano wires.

According to another exemplary embodiment, the structures 242 may include at least any one of inorganic materials (for example, graphene flake, single-walled CNT, double-walled CNT, multi-walled CNT, C60, C85, C70, and the like), metal nano particles (for example, Au, Ag, Cu, Ni, Al, and the like), semiconductor materials (for example, Si, C, GaAs, ZnSe, InP, CdS, and the like), semiconductor oxide materials ($SiO_2$, ZnO, $Al_2O_3$, $In_2O_3$, $SnO_2$, and the like), semiconductor quantum dot materials (for example, CdSe/CdSe, CdSe/ZnTe, ZnSe/ZnS, PbS/CdS, ZnS/CdSe, CdS/ZnS, and the like) in the form of core/shell, or semiconductor nano wire materials (for example, ZnO/ZnS, AlP/AlN, AlN/AlAs, and the like) in the form of core/shell. In addition to the above-described examples, the structures 242 may include other materials.

The mixed solution 240 including the structures 242 is supplied onto the upper surface of the substrate 200, so that the mixed solution 240 including the structures 242 may be spread on the peeling layer 220 (S220). According to an exemplary embodiment, the mixed solution 240 may be supplied onto the substrate 200 so as not to cover the entire upper surface of the peeling layer 220. For example, if a mixed solution is supplied onto a substrate having a size of 25×25 mm2, the mixed solution of about 10 µl to 15 µl may be supplied.

Among the structures 242 included in the mixed solution 240 supplied onto the substrate 200, the structures 242 having relatively small mass can be spread farther from a location 240P where the mixed solution 240 is supplied to the substrate 200 than the structures 242 having relatively great mass. In other words, as the structure 242 is closer to the location 240P where the mixed solution 240 is supplied to the substrate 200, the structure 242 may have a greater mass and/or size. Further, as the structure 240 is farther from the location 240P where the mixed solution 240 is supplied to the substrate 200, the structure 242 may have a smaller mass and/or size. For example, if the structure 242 is a silver nano structure including a silver nano particle and a silver nano wire, a relatively long silver nano wire may be disposed in an area close to the location 240P where the mixed solution 240 is supplied to the substrate 200 and a relatively short silver nano wire or a silver nano particle may be disposed in an area far from the location 240P where the mixed solution 240 is supplied to the substrate 200.

According to an exemplary embodiment, the process of supplying the mixed solution 240 onto the substrate 200 and spreading the mixed solution 240 may include a process of drying the mixed solution 240. In other words, after the mixed solution 240 is completely spread on the substrate 200 and before the structures 242 are randomly disposed within the mixed solution 240, the mixed solution 240 may be dried, so that random disposal of the structures 242 can be suppressed. For example, the mixed solution 240 may be dried by applying heat to the mixed solution 240.

Referring to FIG. 10 through FIG. 12, a part of the mixed solution 240 spread on the substrate 200 may be collected (S230). The collected part of the mixed solution 240 may be located within a predetermined distance range D1 to D2 from the location 240P where the mixed solution 240 is supplied to the substrate 200. In a plain view, the part of the mixed solution 240 located within the predetermined distance range D1 to D2 from the location 240P where the mixed solution 240 is supplied to the substrate 200 may have a doughnut shape. The structures 242 included in the remaining part of the mixed solution 240 may have substantially the same mass and/or size.

The process of collecting of the part of the mixed solution 240 may include removing the rest of the mixed solution 240 located out of the predetermined distance range D1 to D2 from the location 240P where the mixed solution 240 is supplied to the substrate 200 and collecting the remaining part of the mixed solution 240. According to an exemplary embodiment, the rest of the mixed solution 240 may be removed by a physical method.

The structures 242 included in the collected part of the mixed solution 240 may be recovered from the part of the mixed solution 240 (S240). The process of recovering the structures 242 from the part of the mixed solution 240 may include supplying a solution 250 that dissolves the remaining part of the mixed solution 240 and the peeling layer 220 on the substrate 200 and recovering the structures 242 from the solution 250 including the structures 242 included in the remaining part of the mixed solution 240. According to an exemplary embodiment, the process of recovering the structures 242 may include recovering the structures 242 from the solution 250 in which the part of the mixed solution 240 is dissolved, with a centrifuge.

According to an exemplary embodiment of the present disclosure, a mixed solution including structures different from each other in mass is supplied onto a substrate and spread on the substrate, and only a part of the mixed solution located within a predetermined distance range from a location where the mixed solution is supplied is collected. Thus, structures having substantially the same mass and/or size can be refined from the collected part of the mixed solution through a simple process.

If structures having substantially the same mass and/or size are refined from structures different from each other in mass and/or size using a filter or a centrifuge without the spreading process according to an exemplary embodiment of the present disclosure, the structures may be deformed or cut during the refining process.

However, as described above, according to an exemplary embodiment of the present disclosure, if structures having substantially the same mass and/or size are refined using a difference in degree of spread depending on the mass, a refining method of a nano/micro structure with minimized deformation and cutting of the structures and an improved production yield can be provided.

FIG. 7 through FIG. 11 illustrate that a mixed solution is supplied to a substrate including an upper surface in parallel to the ground. However, according to another exemplary embodiment of the present disclosure, the upper surface of the substrate to which the mixed solution is supplied may be inclined to the ground. Details thereof will be described with reference to FIG. 13 through FIG. 15.

FIG. 13 through FIG. 15 are diagrams provided to explain a method for refining a nano/micro structure according to another exemplary embodiment of the present disclosure.

Referring to FIG. 13, a substrate 205 and a supporting table 201 that supports the substrate 205 are provided. The substrate 205 may be of the same kind as the substrate 200 described above with reference to FIG. 7. The substrate 205 may be extended in a direction to be adjacent to the ground.

An upper surface 104 of the substrate 205 may be not parallel but inclined to the ground due to the supporting table 201. FIG. 13 illustrates that the supporting table 201 and the substrate 205 are separate components. However, the supporting table 201 and the substrate 205 may be formed as one body.

As described above with reference to FIG. 7, a pretreatment may be performed to the upper surface 104 of the substrate 205 using at least any one of plasma, UV (ultra violet), or ozone.

Referring to FIG. 14, a peeling layer 222 may be formed on the substrate 205. Since the peeling layer 222 is conformal in thickness, an upper surface of the peeling layer 222 may also be inclined to the ground in the same manner as the upper surface 104 of the substrate 205. The peeling layer 222 may be extended in a direction to be adjacent to the ground. The peeling layer 222 may be formed by the method described above with reference to FIG. 8.

Referring to FIG. 15, the mixed solution 240 including structures may be prepared as described above with reference to FIG. 9. The mixed solution 240 may be supplied onto the upper surface of the peeling layer 222 inclined to the ground. A location 240P where the mixed solution 240 is supplied to the substrate 205 may be higher than the ground. Thus, the mixed solution 240 may be spread on the peeling layer 222 toward the ground. Since the mixed solution 240 is supplied onto the upper surface of the peeling layer 222/the upper surface of the substrate 205 inclined to the ground, the mixed solution 240 can be easily spread. The process of spreading the mixed solution 240 may include a process of drying the mixed solution as described above with reference to FIG. 9.

As described above with reference to FIG. 9, among the structures included in the mixed solution 240, the structures having relatively small mass can be spread farther from the location 240P where the mixed solution 240 is supplied onto the substrate 205 than the structures having relatively great mass. That is, the structures having relatively small mass and/or size may be disposed adjacent to the ground and the structures having relatively great mass and/or size may be disposed far from the ground.

Then, as described above with reference to FIG. 10 through FIG. 12, a part 240A of the mixed solution 240 located within predetermined distance range from the location 240P where the mixed solution 240 is supplied onto the substrate 205 is collected. Thus, the structures having substantially the same mass and/or size can be refined.

A refining apparatus for a nano/micro structure to which the method for refining a nano/micro structure according to the above-described exemplary embodiment of the present disclosure will be described with reference to FIG. 16 through FIG. 18.

FIG. 16 is a diagram provided to explain a refining apparatus for a nano/micro structure according to an exemplary embodiment of the present disclosure.

Referring to FIG. 16, a refining apparatus for a nano/micro structure according to an exemplary embodiment of the present disclosure may include the substrate 205, a mixed solution supply unit 310, a substrate pretreatment supply unit 320, and an inclination adjusting unit 330.

The substrate 205 may include an upper surface inclined to the ground as described above with reference to FIG. 13. The substrate 205 may be supported on a supporting table 202. FIG. 16 illustrates that the supporting table 202 and the substrate 205 are separate components. However, the supporting table 202 and the substrate 205 may be formed as one body.

The mixed solution supply unit 310 may supply a mixed solution including structures different from each other in mass onto the upper surface of the substrate 205, as described above with reference to FIG. 9. The mixed solution supply unit 310 may supply the mixed solution onto a part of the upper surface of the substrate 205 placed at a relatively high location from the ground.

According to an exemplary embodiment, the mixed solution supply unit 310 may drop the mixed solution to one point of the upper surface of the substrate 205. According to another exemplary embodiment, the mixed solution supply unit 310 may supply the mixed solution to the upper surface of the substrate 205 in the form of a line extended in one direction. The one direction may intersect with an extension direction of the upper surface of the substrate 205 toward the ground.

The substrate pretreatment supply unit 320 may supply at least any one of plasma, UV (ultra violet), or ozone to the upper surface of the substrate 205, as described above with reference to FIG. 1, in order to perform a pretreatment to the upper surface of the substrate 205.

The inclination adjusting unit 330 may adjust an inclination between the upper surface of the substrate 205 and the ground. For example, the inclination adjusting unit 330 may be a lifting device provided between the supporting table 202 and the substrate 205. FIG. 16 illustrates that the inclination adjusting unit 330 adjusts a height of a part of the substrate 205 adjacent to the ground to adjust an inclination between the upper surface of the substrate 205 and the ground. However, the inclination adjusting unit 330 may adjust a height of a part of the substrate 205 placed at a relatively high location from the ground to adjust an inclination between the upper surface of the substrate 205 and the ground.

According to an exemplary embodiment, the inclination adjusting unit 330 may maintain an inclination between the upper surface of the substrate 205 and the ground at a predetermined angle while the mixed solution is supplied onto the upper surface of the substrate 205. According to another exemplary embodiment, the inclination adjusting unit 330 may change an inclination between the upper surface of the substrate 205 and the ground while the mixed solution is supplied onto the upper surface of the substrate 205.

Unlike the illustration in FIG. 16, a plurality of substrates each including an upper surface inclined to the ground may be provided. Details thereof will be described with reference to FIG. 17 and FIG. 18.

FIG. 17 is a diagram provided to explain a refining apparatus for a nano/micro structure according to another exemplary embodiment of the present disclosure.

Referring to FIG. 17, the substrate 205 including the upper surface inclined to the ground illustrated with reference to FIG. 16 may be provided plural in number. Parts of the upper surfaces of the plurality of substrates 205 placed at a relatively high location from the ground may be disposed to be adjacent to each other. Therefore, the single mixed solution supply unit 310 can easily supply the mixed solution to the upper surfaces of the plurality of substrates 205. Thus, nano/micro structures can be continuously refined.

FIG. 17 illustrates that the single mixed solution supply unit 310 is provided. However, two or more mixed solution supply units may be provided.

Unlike the illustration in FIG. 16 and FIG. 17, an upper surface of a substrate may be increased in size as being closer to the ground. Details thereof will be described with reference to FIG. 18.

FIG. 18 is a diagram provided to explain a refining apparatus for a nano/micro structure according to yet another exemplary embodiment of the present disclosure.

Referring to FIG. 18, unlike the illustration with reference to FIG. 17, upper surfaces of the plurality of substrates 205a supported on a plurality of supporting tables 205a may be gradually increased in size as being closer to the ground. In other words, a part of the upper surface of the substrate 205a located relatively adjacent to the ground may be wider than a part of the upper surface of the substrate 205a located relatively far from the ground. Thus, a part of a mixed solution spread on the upper surface of the substrate 205a can be easily collected.

Upper surfaces of the plurality of supporting tables 205a that support the plurality of substrates 205a may also be gradually increased in size as being closer to the ground, in the same manner as the upper surfaces of the plurality of substrates 205a.

Hereinafter, the results of a spread experiment of structures according to a method for refining a nano/micro structure in accordance with an exemplary embodiment of the present disclosure will be described.

FIG. 19 is a microscopic image of a spread experiment of structures according to a method for refining a nano/micro structure in accordance with an exemplary embodiment of the present disclosure.

Referring to FIG. 19, 10 μl to 15 μl of methanol including silver nano wires was supplied onto a glass substrate having a size of 25×25 mm2 by drop-casting. It can be seen that the silver nano wires are spread depending on the mass from a central portion of the glass substrate to which the methanol including the silver nano wires is supplied.

Specifically, it was observed that an area (a) adjacent to the central portion of the glass substrate to which the methanol is supplied includes a small number of silver nano wires of 30 μm or more, and silver nano wires and silver nano particles of 5 μm to 15 μm. It was observed that an area (b) includes silver nano wires of about 30 win at a relatively high density and also includes a considerable number of silver nano particles. Further, it was observed that an area (c) includes silver nano wires of about 30 μm at the highest density. Furthermore, it was observed that areas (d) and (e) mostly include silver nano wires of 10 μm or less and silver nano particles.

That is, it was observed that the silver nano wires have various degrees of spread depending on the mass, and, thus, it can be seen that nano/micro structures having substantially the same size can be selected and refined using a difference in degree of spread depending on the mass of a nano/micro structure.

A manufacturing method and a manufacturing apparatus for a nano/micro structure network according to an exemplary embodiment of the present disclosure will be described.

FIG. 20 is a flowchart provided to explain a method for manufacturing a nano/micro structure network according to an exemplary embodiment of the present disclosure, FIG. 21 through FIG. 23 are perspective views provided to explain a method for manufacturing a nano/micro structure network according to an exemplary embodiment of the present disclosure, and FIG. 24 is a diagram provided to explain a network formed between contact points of structures according to a method for manufacturing a nano/micro structure network in accordance with an exemplary embodiment of the present disclosure.

Referring to FIG. 20 and FIG. 21, a base layer 410 may be formed on a substrate 400 (S410).

The substrate 400 may be a semiconductor substrate, a plastic substrate, and/or a glass substrate. The substrate 400 may be flexible. For example, the substrate 400 may include any one of a glass substrate, polyethylene terephthalate (PET), polyethylene naphthalate (PEN), polycarbonate (PC), polyether sulfone (PES), polyimide (PI), or acrylite.

The base layer 410 may include a plurality of conductive structures. According to an exemplary embodiment, the structures may be silver nano structures such as silver nano particles and silver nano wires.

According to another exemplary embodiment, the structures in the base layer 410 may include at least any one of inorganic materials (for example, graphene flake, single-walled CNT, double-walled CNT, multi-walled CNT, C60, C85, C70, and the like), metal nano particles (for example, Au, Ag, Cu, Ni, Al, and the like), semiconductor materials (for example, Si, C, GaAs, ZnSe, InP, CdS, and the like), conductive organic materials (for example, PEDOT:PSS, PVP, and the like), semiconductor oxide materials (SiO2, ZnO, Al2O3, In2O3, SnO2, and the like), semiconductor quantum dot materials (for example, CdSe/CdSe, CdSe/ZnTe, ZnSe/ZnS, PbS/CdS, ZnS/CdSe, CdS/ZnS, and the like) in the form of core/shell, or semiconductor nano wire materials (for example, ZnO/ZnS, AlP/AlN, AlN/AlAs, and the like) in the form of core/shell in addition to the silver nano structures.

The process of forming the base layer 410 including the structures on the substrate 400 may be performed by bar coating, spray coating, spin coating, brush coating, dip coating, gravure coating, or the like.

Before the base layer 410 is formed on the substrate 400, a pretreatment may be performed to an upper surface of the substrate 400. Due to the pretreatment of the substrate 400, surface energy of the substrate 400 may be reduced. According to an exemplary embodiment, the pretreatment of the substrate 400 may include supplying at least any one of plasma, UV (ultra violet), or ozone to the upper surface of the substrate 400. For example, plasma using oxygen (O), argon (Ar), nitrogen (N), or hydrogen (H) gas may be supplied to the upper surface of the substrate 400.

A first point P1 and a second point P2 different from the first point P1 of the base layer 410 may be selected. The first point P1 and the second point P2 may be any points on the base layer 410. For example, the first point P1 and the second point P2 may be points adjacent to edges of the base layer 410.

By applying a current between the first point P1 and the second point P2, a first network 421 in which the first point P1 and the second point P2 are electrically connected by the structures may be formed (S420). The first network 421 in which the first point P1 and the second point P2 are electrically connected may substantially correspond to a current path flowing between the first point P1 and the second point P2.

Joule heat is generated by the current flowing between the first point P1 and the second point P2. As illustrated in FIG. 5, a current junction may be formed by the joule heat at a contact point 415a where the structures 415 within the base layer 410 intersect with each other. That is, the contact point 415a where the structures 415 disposed adjacent to the current path intersect with each other has a relatively high resistance. Accordingly, the joule heat may be generated at the contact point 415a of the structures 415 by a current flowing between the first point P1 and the second point P2. Due to the joule heat, atoms constituting the structures 415 are moved, so that the structures 415 separated from each other may be directly connected to each other or a distance between the structures 415 separated from each other may be reduced. Accordingly, the resistance at the contact point 415a of the structures 415 may be reduced, and the first network 421 in which the first point P1 and the second point P2 are electrically connected may be formed.

For example, if the structures 415 are silver nano structures, joule heat may be generated at a contact point where the silver nano structures intersect with each other by the current flowing between the first point P1 and the second point P2. Due to the joule heat, silver atoms constituting the silver nano structures are moved through a polymer material surrounding the silver nano structures, so that the silver nano structures separated from each other may be connected to each other.

Referring to FIG. 20 and FIG. 21, after the first network 421 is formed, a third point P3 and a fourth point P4 of the base layer 410 may be selected. The third point P3 and the fourth point P4 may be any points different from the first point P1 and the second point P2. For example, the third point P3 and the fourth point P4 may be points adjacent to edges of the base layer 410.

By applying a current between the third point P3 and the fourth point P4, a second network 422 in which the third point P3 and the fourth point P4 are electrically connected by the structures may be formed (S430). The second network 422 in which the third point P3 and the fourth point P4 are electrically connected may substantially correspond to a current path flowing between the third point P3 and the fourth point P4. The current path flowing between the third point P3 and the fourth point P4 may be different from the current path flowing between the first point P1 and the second point P2.

Joule heat is generated by the current flowing between the third point P3 and the fourth point P4. As illustrated in FIG. 5, the structures 415 adjacent to the current path flowing between the third point P3 and the fourth point P4 may be electrically connected to each other by the joule heat.

Referring to FIG. 4, after the first and second networks 421 and 422 are formed, a current may be applied between points other than the first to fourth points P1 to P4, so that a plurality networks 420 electrically connected by the structures may be further formed.

According to an exemplary embodiment of the present disclosure, the base layer 410 including conductive structures is formed on the substrate 400, and then, a plurality of processes of applying a current between any two points of the base layer 410 may be performed. Accordingly, a plurality of current paths different from each other may be provided in the base layer 410 and a plurality of networks different from each other may be formed so as to correspond to the plurality of current paths different from each other. Since the network in which the structures of the base layer 410 are electrically connected is formed, a resistance of the base layer 410 can be reduced. Further, since the plurality of networks is provided, a sheet resistance of the base layer 410 may be substantially uniform.

If the formation process of the network is omitted unlike the above-described exemplary embodiment of the present disclosure, the resistance may be increased due to a polymer/insulation material present between the structures. Further, if a heat treatment is performed to the structures to reduce the resistance, the substrate may be damaged.

However, as described above, according to an exemplary embodiment of the present disclosure, a plurality of current paths different from each other may be provided, so that a plurality of networks in which the structures are electrically connected may be formed. Accordingly, it is possible to provide a method for manufacturing a nano/micro structure with minimized damage to a substrate and a minimized resistance and a substantially uniform sheet resistance of the base layer 410.

Hereinafter, a manufacturing apparatus for manufacturing a nano/micro structure according to the above-described method for manufacturing a nano/micro structure will be described.

FIG. 25 is a diagram provided to explain a manufacturing apparatus for a nano/micro structure network according to an exemplary embodiment of the present disclosure.

Referring to FIG. 25, a manufacturing apparatus for a nano/micro structure network according to an exemplary embodiment of the present disclosure includes a support structure 510, a plurality of electrodes 521, 522, 523, and 524 disposed adjacent to edges of the support structure 510, and a control unit 550 that controls the plurality of electrodes 521, 522, 523, and 524.

The support structure 510 may be disposed on the substrate 400 described with reference to FIG. 21 through FIG. 23 and the base layer 410 disposed on the substrate 400 and including the conductive structures. The support structures 510 may include first to fourth sides. According to an exemplary embodiment, a size of the support structure 510 may be similar to that of the base layer 410. The support structure 510 may be formed of an insulation material.

The plurality of electrodes 521, 522, 523, and 524 may include a first group 521 disposed along the first side of the support structure 510, a second group 522 disposed along the second side of the support structure 510, a third group 523 disposed along the third side of the support structure 510, and a fourth group 524 disposed along the fourth side of the support structure 510. According to an exemplary embodiment, the plurality of electrodes 521, 522, 523, and 524 may be disposed adjacent to the edges of the support structure 510 and thus may correspond to the edges of the base layer 410.

FIG. 6 illustrates that four or five electrodes are disposed along each side of the support structure 510. However, the number of the electrodes may be three or less, or six or more.

In a state where the plurality of electrodes 521, 522, 523, and 524 is in contact with the base layer 410, the control unit 550 may apply a current between first and second electrodes selected from the plurality of electrodes 521, 522, 523, and 524. According to an exemplary embodiment, the first and second electrodes may be included in different groups. For example, the first electrode may be included in the first group 521 and the second electrode may be included in the third group 523. Due to the current applied between the first electrode and the second electrode, a current may flow between a first point of the base layer 410 in contact with the first electrode and a second point of the base layer 410 in contact with the second electrode. Due to the current flowing between the first point and the second point, a first network in which the first point and the second point are electrically connected by the structures may be formed, as described above with reference to FIG. 20 through FIG. 24.

After the first network is formed, in a state where the plurality of electrodes 521, 522, 523, and 524 is in contact with the base layer 410, the control unit 550 may apply a current between third and fourth electrodes from the electrodes other than the first electrode and the second electrode among the plurality of electrodes 521, 522, 523, and 524. According to an exemplary embodiment, the third and fourth electrodes may be included in different groups. For example, the third electrode may be included in the second group 522 and the fourth electrode may be included in the fourth group 524. Due to the current applied between the third electrode and the fourth electrode, a current may flow between a third point of the base layer 410 in contact with the third electrode and a fourth point of the base layer 410 in contact with the fourth electrode. Due to the current flowing between the third point and the fourth point, a second network in which the third point and the fourth point are electrically connected by the structures may be formed, as described above with reference to FIG. 20 through FIG. 24.

According to an exemplary embodiment, a magnitude of the current and/or an application time of the current applied between the first electrode and the second electrode for forming the first network may be substantially the same as a magnitude of the current and/or an application time of the current applied between the third electrode and the fourth electrode for forming the second network.

By repeating the process of forming the first network and the process of forming the second network, the method for manufacturing a nano/micro structure network described with reference to FIG. 20 through FIG. 24 can be performed by the manufacturing apparatus for a nano/micro structure network according to an exemplary embodiment of the present disclosure.

FIG. 26 and FIG. 27 are diagrams provided to explain a manufacturing apparatus for a nano/micro structure network according to another exemplary embodiment of the present disclosure.

Referring to FIG. 26, a manufacturing apparatus for a nano/micro structure network according to another exemplary embodiment of the present disclosure may include a first electrode 610, a second electrode 620 separated from the first electrode 610, a support rod 630, a rotation rod 640, and a control unit 650 that controls the first electrode 610, the second electrode 620, and the rotation rod 640. The manufacturing apparatus for a nano/micro structure network according to another exemplary embodiment of the present disclosure may be disposed on the substrate 400 described above with reference to FIG. 21 through FIG. 23 and the base layer 410 disposed on the substrate 400 and including the conductive structures.

The first electrode 610 and the second electrode 620 may be separated from each other and extended in a first direction. The first direction may be a direction perpendicular to the upper surface of the base layer 410. According to an exemplary embodiment, a length of the first electrode 610 may be substantially the same as that of the second electrode 620.

One end of the first electrode 610 and one end of the second electrode 620 may be respectively connected to both ends of the support rod 630. According to an exemplary embodiment, the first electrode 610 and the second electrode 620 may be fixed to the support rod 630.

The rotation rod 640 may be connected to a central portion of the support rod 630 and extended in the first direction. The rotation rod 640 may be rotated around the first direction as a rotation axis. Accordingly, the support rod 630 may be rotated around the rotation rod 640 as a rotation axis, and the first electrode 610 and the second electrode 620 connected to the both ends of the support rod 630 may be rotated. The first electrode 610 and the second electrode 620 may be fixed to the both ends of the support rod 630. Thus, even if the rotation rod 640 is rotated, a distance between the first electrode 610 and the second electrode 620 may be uniformly maintained.

In a state where the other ends of the first electrode 610 and the second electrode 620 are in contact with the base layer 410, the control unit 650 may apply a current between the first electrode 610 and the second electrode 620. Due to the current applied between the first electrode 610 and the second electrode 620, a current may flow between a first point of the base layer 410 in contact with the first electrode 610 and a second point of the base layer 410 in contact with the second electrode 620. According to an exemplary embodiment, the first point and the second point may be adjacent to the edges of the base layer 410. Due to the current flowing between the first point and the second point, a first network 661 in which the first point and the second point are electrically connected by the structures may be formed, as described above with reference to FIG. 20 through FIG. 24.

After the first network 661 is formed, the control unit 650 may rotate the rotation rod 640. Accordingly, the first electrode 610 and the second electrode 620 may be respectively brought into contact with a third point and a fourth point of the base layer 410. As described above, even if the rotation rod 640 is rotated, a distance between the first electrode 610 and the second electrode 620 is uniformly maintained. Thus, a distance between the first point and the second point may be substantially the same as a distance between the third point and the fourth point.

In a state where the other ends of the first electrode 610 and the second electrode 620 are in contact with the third point and the fourth point of the base layer 410, the control unit 650 may apply a current between the first electrode 610 and the second electrode 620. Due to the current applied between the first electrode 610 and the second electrode 620, a current may flow between the third point and the fourth point. Due to the current flowing between the third point and the fourth point, a second network 662 in which the third point and the fourth point are electrically connected by the structures may be formed, as described above with reference to FIG. 20 through FIG. 24.

According to an exemplary embodiment, a magnitude of the current and/or an application time of the current applied between the first electrode 610 and the second electrode 620 for forming the first network 661 may be substantially the same as a magnitude of the current and/or an application time of the current applied between the first electrode 610 and the second electrode 620 for forming the second network 662. Further, as described above, since the distances between the points between which a current is applied by the first electrode 610 and the second electrode 620 are the same, a difference in length between a plurality of networks formed by the current applied by the first electrode 610 and the second electrode 620 can be minimized. Therefore, the uniformity in sheet resistance of the base layer 410 can be improved.

By repeating the process of forming the first network 661 and the process of forming the second network 662, the method for manufacturing a nano/micro structure described with reference to FIG. 20 through FIG. 24 can be performed by the manufacturing apparatus for a nano/micro structure according to an exemplary embodiment of the present disclosure.

Although the present disclosure has been described in detail with reference to the exemplary embodiments, the scope of the present disclosure is not limited to specific exemplary embodiments but should be construed based on the following claims. Further, it would be understood by a person having ordinary skill in the art that various changes and modifications can be made without departing from the scope of the present disclosure.

INDUSTRIAL APPLICABILITY

The present disclosure relates to a substrate, a method for manufacturing the same, a method for refining a nano/micro structure, a method for manufacturing a nano/micro structure network, and a manufacturing apparatus therefor and is applied to technologies of various fields such as organic light emitting elements, liquid crystal displays, touch panels, or solar cells, etc.

The invention claimed is:

1. A method for manufacturing a substrate including nano/micro structures, comprising:
    forming a nano material on an upper surface of an auxiliary substrate;
    forming nano/micro structures on the upper surface of the auxiliary substrate;
    coating a base solution on the nano/micro structures to fill gaps between the nano/micro structures and the auxiliary substrate and between the nano/micro structures;
    forming a base substrate covering the nano/micro structures by performing a heat treatment to the base solution;
    removing the auxiliary substrate from the base substrate to expose a main planar surface at a top surface of the base substrate adjacent to the upper surface of the auxiliary substrate, the exposed main planar surface including at least a first portion without the nano/micro structures and the nano material, a second portion including the nano/micro structures, and a third portion including the nano material, wherein the first portion, the second portion, and the third portion are disposed in a same plane; and performing a heat treatment process to the base substrate for improving the bondability of the nano/micro structures after the main planar surface is exposed, and wherein the nano material includes at least any one of graphene flake, single-walled CNT, double-walled CNT, multi-walled CNT, C60, C85, or C70, and wherein the nano/micro structures include metal nano wires, and the nano material improves the bonding and a dispersity of the nano/microstructures compared to the base substrate without the nano material.

2. The method for manufacturing a substrate including nano/micro structures of claim 1, wherein the base solution fills gaps between the nano/micro structures and the auxiliary substrate.

3. The method for manufacturing a substrate including nano/micro structures of claim 1, further comprising:
performing a pretreatment process for reducing surface energy of the upper surface of the auxiliary substrate before forming the nano/micro structures on the auxiliary substrate.

4. The method for manufacturing a substrate including nano/micro structures of claim 1, further comprising:
forming a releasing layer on the upper surface of the auxiliary substrate before forming the nano/micro structures,
wherein the nano/micro structures are formed on the releasing layer, and the separating of the auxiliary substrate from the base substrate includes removing the releasing layer.

5. The method for manufacturing a substrate including nano/micro structures of claim 1, further comprising:
forming a conductive film on the main planar surface of the base substrate.

6. The method for manufacturing a substrate including nano/micro structures of claim 4, wherein the releasing layer is formed using a silicon-based release agent or a fluorine-based release agent.

7. The method for manufacturing a substrate including nano/micro structures of claim 1, further comprising:
performing a heat treatment process for improving the conductivity of the nano/micro structures before the coating the base solution on the nano/micro structures.

8. The method for manufacturing a substrate including nano/micro structures of claim 1, wherein the forming the base substrate comprises fusing at least parts of the nano/micro structures for reducing the resistance of the nano/micro structures.

9. The method for manufacturing a substrate including nano/micro structures of claim 8, wherein parts of the nano/micro structures adjacent to each other are bonded and connected to each other.

10. The method for manufacturing a substrate including nano/micro structures of claim 1, further comprising:
refining the nano/micro structures before forming the nano/micro structures,
wherein the refining the nano/micro structures comprises:
preparing a mixed solution including the nano/micro structures with different dimensions;
spreading the mixed solution including the nano/micro structures on a substrate that is inclined to form a layer on the substrate including subsets of nano/micro structures each having nano/micro structures with substantially same mass or size;
collecting a part of the layer on the substrate, the part of the layer including at least one subset of the nano/micro structures; and
recovering the subset of nano/micro structures included in the collected part of the layer.

11. The method for manufacturing a substrate including nano/micro structures of claim 1, wherein the base solution includes at least one of polyethylene terephthalate (PET), polyethylene naphthalate (PEN), polycarbonate (PC), polyether sulfone (PES), polyimide (PI), poly(methylmethacrylate) (PMMA), or acrylate.

* * * * *